(12) United States Patent
Cai

(10) Patent No.: US 7,602,017 B2
(45) Date of Patent: Oct. 13, 2009

(54) SHORT CHANNEL LV, MV, AND HV CMOS DEVICES

(75) Inventor: Jun Cai, Scarborough, ME (US)

(73) Assignee: Fairchild Semiconductor Corporation, South Portland, ME (US)

( * ) Notice: Subject to any disclaimer, the term of this patent is extended or adjusted under 35 U.S.C. 154(b) by 373 days.

(21) Appl. No.: 11/685,364

(22) Filed: Mar. 13, 2007

(65) Prior Publication Data

US 2008/0224210 A1    Sep. 18, 2008

(51) Int. Cl.
    H01L 29/36    (2006.01)
(52) U.S. Cl. ............... 257/335; 257/376; 257/E29.063
(58) Field of Classification Search .......... 257/327, 257/335, 336, 338, 376, E29.063, E29.109
    See application file for complete search history.

(56) References Cited

U.S. PATENT DOCUMENTS

| | | | |
|---|---|---|---|
| 4,223,334 A | 9/1980 | Gasner et al. | |
| 4,626,879 A | 12/1986 | Colak | |
| 4,974,059 A | 11/1990 | Kinzer | |
| 5,313,082 A | 5/1994 | Eklund | |
| 5,580,799 A | 12/1996 | Funaki | |
| 5,583,067 A * | 12/1996 | Sanchez | 438/289 |
| 5,852,314 A | 12/1998 | Depetro et al. | |
| 6,528,849 B1 | 3/2003 | Khemka et al. | |
| 6,548,842 B1 * | 4/2003 | Bulucea et al. | 257/288 |
| 2005/0146372 A1 | 7/2005 | Elbanhawy | |
| 2006/0138567 A1 | 6/2006 | Lee | |

FOREIGN PATENT DOCUMENTS

JP        12012836 A    1/2000

OTHER PUBLICATIONS

"A 0.25-Micron Smart Power Technology Optimized For Wireless and Consumer Applications", By R. Zhu, V. Parthasarathy, V. Khemka, A. Bose, T. Roggenbauer, G. Lee, B. Baumert, P. Hui, P. Rodriques and D. Collins, Freescale Semiconductor Inc., 2100 E. Elliot Road, Tempe, AZ 85284, USA, printout from World Wide Web dated Apr. 17, 2003 at http://ieeex[lore.ieee.org/Xplore/login.jsp?url=/iel5/8680/27504/01225258.pdf, 5 pgs.
"Power MOSFETs for Switching Power Supply", Toshiba Corporation Semiconductor Company, Discrete Semiconductor Division, 11 pages.

* cited by examiner

Primary Examiner—Minh-Loan T Tran
Assistant Examiner—W. Wendy Kuo
(74) Attorney, Agent, or Firm—Thomas R. FitzGerald, Esq.

(57) ABSTRACT

Low voltage, middle voltage and high voltage CMOS devices have upper buffer layers of the same conductivity type as the sources and drains that extend under the sources and drains and the gates but not past the middle of the gates, and lower bulk buffer layers of the opposite conductivity type to the upper buffer layers extend from under the upper buffer layers to past the middle of the gates forming an overlap of the two bulk buffer layers under the gates. The upper buffer layers and the lower bulk buffer layers can be implanted for both the NMOS and PMOS FETs using two masking layers. For middle voltage and high voltage devices the upper buffer layers together with the lower bulk buffer layers provide a resurf region.

21 Claims, 18 Drawing Sheets

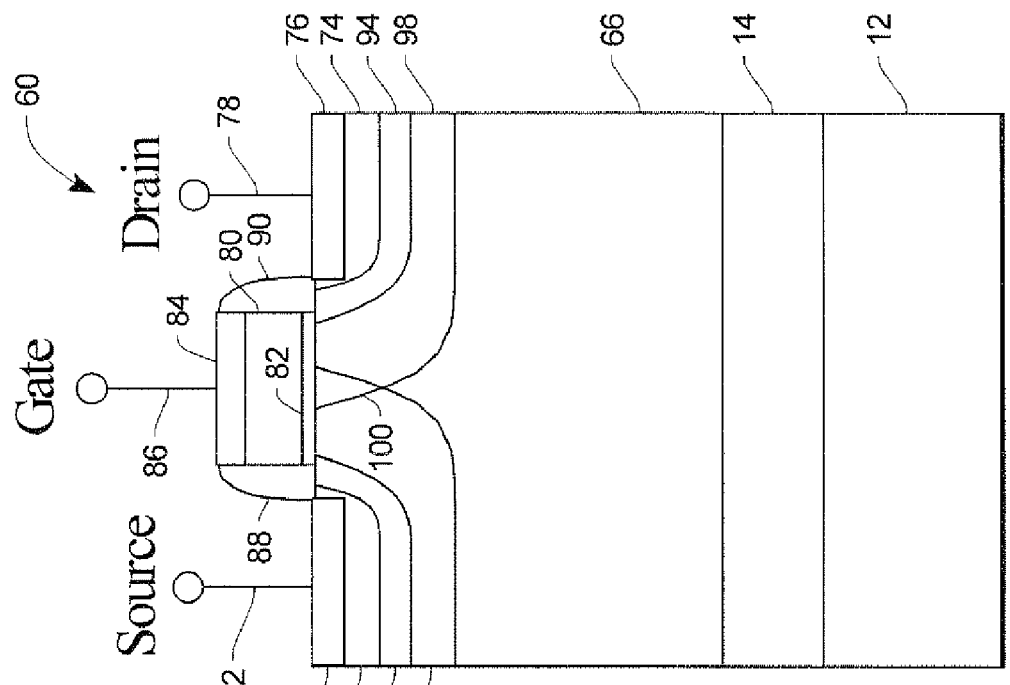
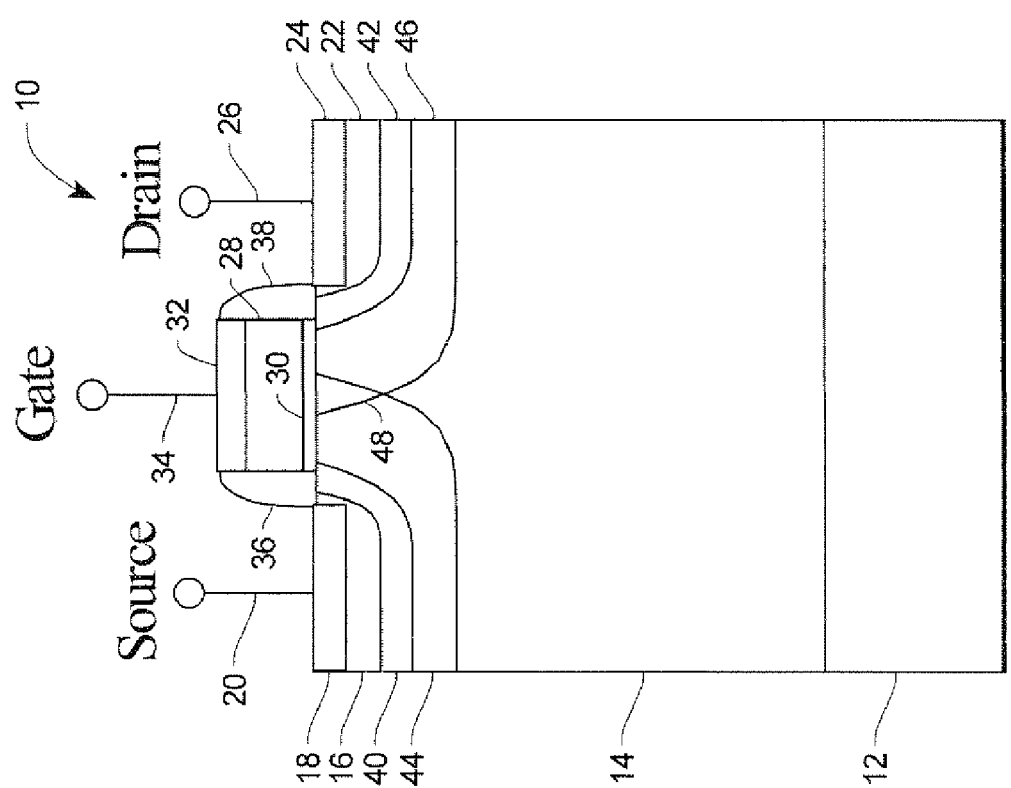

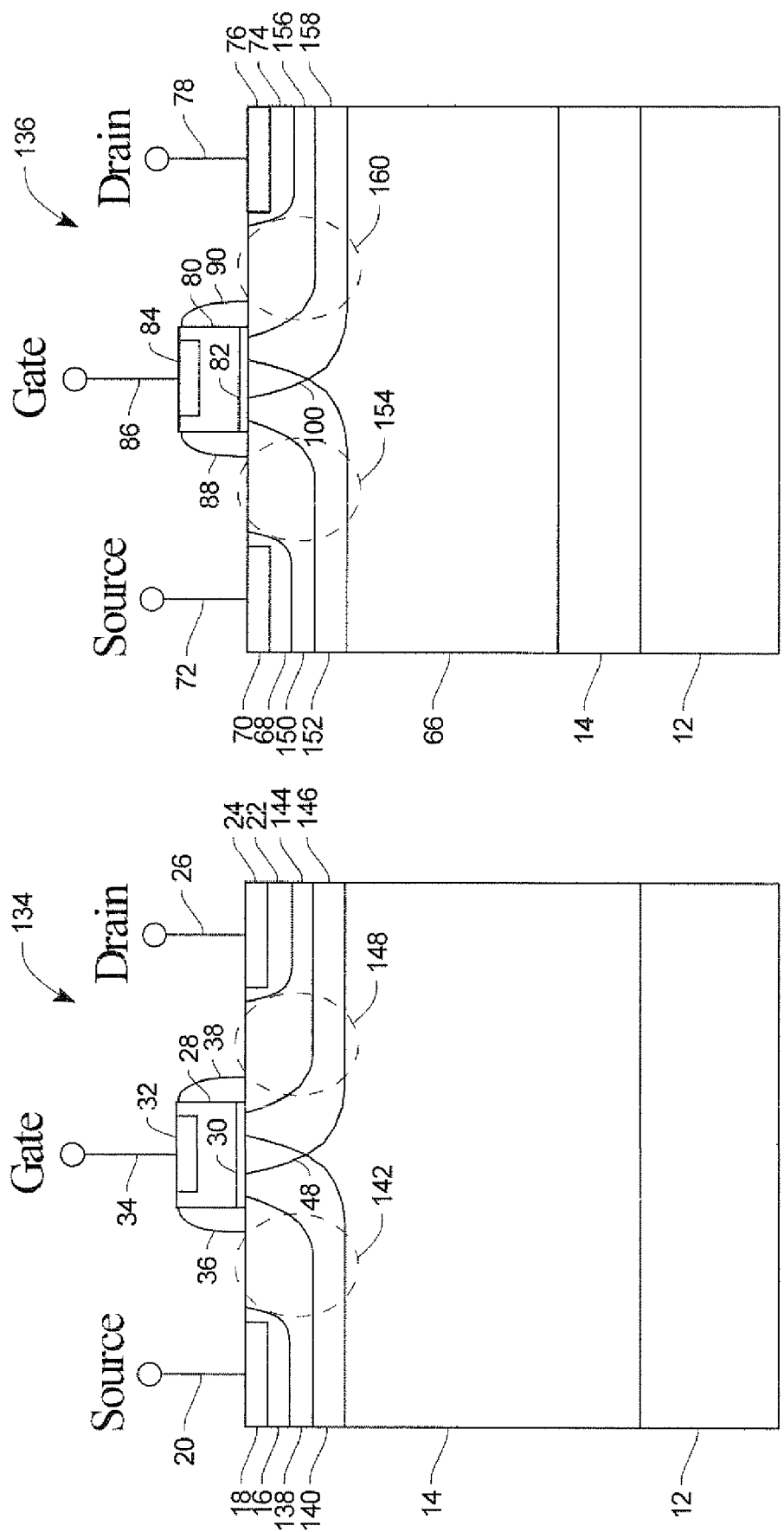

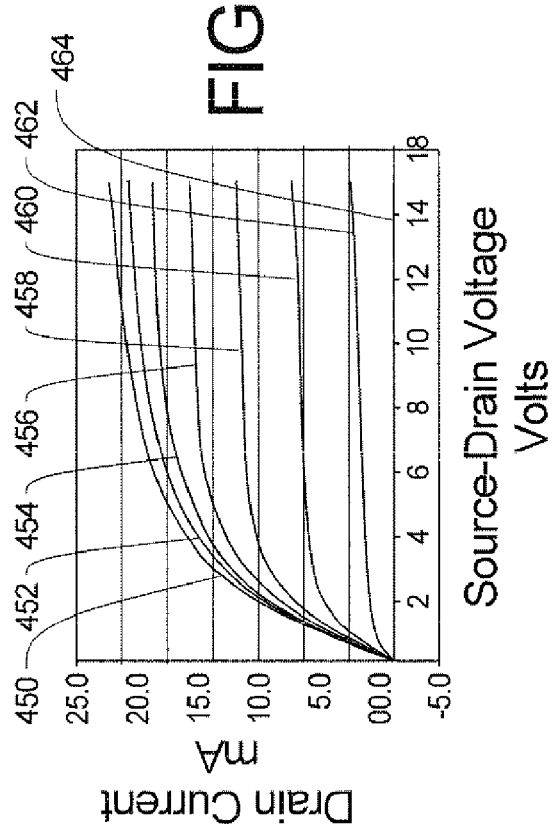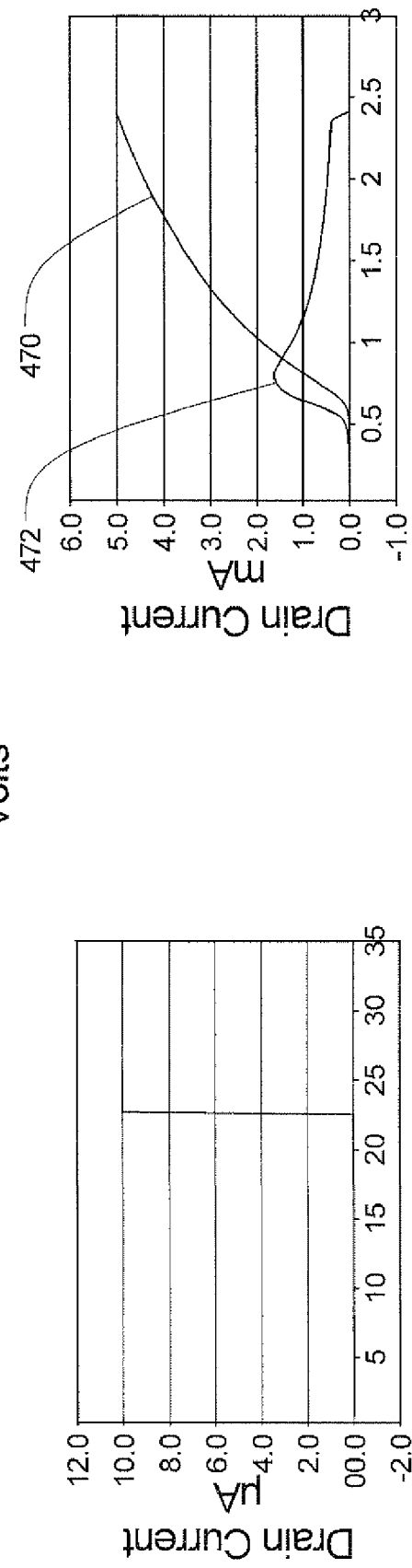

SHORT CHANNEL LV, MV, AND HV CMOS DEVICES

FIELD OF THE INVENTION

This invention relates to complementary MOSFETS, and more particularly to CMOS short channel devices that have LV, MV and HV embodiments.

BACKGROUND OF THE INVENTION

MOSFETs with short channels are advantageous in that they use less area on a chip thereby allowing more functionality on the chip, have lower on resistance ($R_{on}$), and have faster switching characteristics compared to conventional MOSFETs. However, shortening the channel generally gives rise to disadvantages generally known as "short channel effects." Such effects include hot carrier injection (HCI) into the gate oxide and into the device substrate which affect the reliability of the device and can degrade $R_{on}$ of the device. Another short channel effect is the decrease in the punch through voltage of the device, therefore, the decrease in the drain to source breakdown voltage ($BV_{dss}$) of the device. The effect is particularly problematic for MOSFETs which are used in medium voltage and high voltage applications, especially if such MOSFETs are on the same die as low voltage circuits.

Therefore, short channel LV, MV, and HV CMOS devices which reduce these short channel effects compared to prior art short channel MOSFETs is desirable.

Further, short channel MV and HV CMOS devices which can be placed on the same die as LV devices is also desirable.

SUMMARY OF THE INVENTION

The invention comprises, in one form thereof an N channel MOSFET (NMOS) having a P⁻ epitaxial layer on a substrate with a source and a drain formed in the epitaxial layer and located on opposite sides of a gate lying on a gate oxide which lies on the epitaxial layer. A first N type buffer layer extends from under the source laterally to a position between a first edge of the gate closest to the source at a top surface of the epitaxial layer and a middle of the gate, and a second N type buffer layer extends from under the drain laterally to a position between a second edge of the gate closest to the drain at the top surface of the epitaxial layer and the middle of the gate. In addition, a first P type bulk layer extends from under the first N type buffer layer laterally to a position under the gate at the top surface of the epitaxial layer which is closer to the drain than to the source, and a second P type bulk layer extends from under the second N type buffer layer laterally to a position under the gate at the top surface of the epitaxial layer which is closer to the source than to the drain, the first and second P type bulk layers overlying each other in a region under the gate.

The invention comprises, in another form thereof, a P channel MOSFET (PMOS) having a P⁻ epitaxial layer on a substrate and an N⁻ tub formed in the epitaxial layer. A source and a drain are formed in the epitaxial layer and located on opposite sides of a gate lying on a gate which lies on the epitaxial layer. A first P type buffer layer extends from under the source laterally to a position between a first edge of the gate closest to the source at a top surface of the epitaxial layer and a middle of the gate, and a second P type buffer layer extends from under the drain laterally to a position between a second edge of the gate closest to the drain at the top surface of the epitaxial layer and the middle of the gate. In addition, a first N type bulk layer extends from under the first P type buffer layer laterally to a position under the gate at the top surface of the epitaxial layer which is closer to the drain than to the source, and a second N type bulk layer extends from under the second P type buffer layer laterally to a position under the gate at the top surface of the epitaxial layer which is closer to the source than to the drain, the first and second N type bulk layers overlying each other in a region under the gate.

The invention comprises, in still another form thereof, a pair of complementary N channel MOSFET (NMOS) and P channel MOSFET (PMOS) (CMOS) devices formed on a substrate, include the above described NMOS FET and the above described PMOS FET.

In still another form, the invention includes a method for forming a N channel MOSFET (NMOS) by growing a P⁻ epitaxial layer on a P⁺ substrate, forming a gate oxide layer lying on the epitaxial layer, and forming a gate on the gate oxide layer. The method also includes forming two upper N type buffer regions self aligned with opposite sides of the gate and two lower P type bulk buffer regions self aligned with opposite sides of the gate, each lying below one of the upper buffer regions, the lower bulk buffer regions extending laterally past the middle of the gate such that the two lower bulk buffer regions overlap under the gate, the upper buffer regions and the lower bulk buffer regions formed after a single masking operation.

In yet another form, the invention includes a method for forming a P channel MOSFET (PMOS) by growing a P⁻ epitaxial layer on a P⁺ substrate, forming an N⁻ tub in the epitaxial layer which extends to a top surface of the epitaxial layer, forming a gate oxide layer lying on the epitaxial layer, and forming a gate on the gate oxide layer. The method further includes forming two upper P type buffer regions self aligned with opposite sides of the gate and two lower N type bulk buffer regions self aligned with opposite sides of the gate, each lying below one of the upper buffer regions, the lower bulk buffer regions extending laterally past the middle of the gate such that the two lower bulk buffer regions overlap under the gate, the upper buffer regions and the lower bulk buffer regions formed after a single masking operation.

In an additional form, the invention includes a method for forming a complementary MOS (CMOS) device by forming an NMOS FET according to the process described above and forming a PMOS FET according to the process described above, the N– tub extending laterally across the PMOS FIST.

BRIEF DESCRIPTION OF THE DRAWINGS

The features and advantages of this invention, and the manner of attaining them, will become apparent and be better understood by reference to the following description of the various embodiments of the invention in conjunction with the accompanying drawings, wherein:

FIGS. 1A and 1B are diagrammatic views of a low voltage (LV) N channel MOSFET (NMOS) and a LV P channel MOSFET (PMOS), respectively, according to the present invention;

FIGS. 3A and 3B are diagrammatic views of a middle voltage (MV) N channel MOSFET (NMOS) and a MV P channel MOSFET (PMOS), respectively, according to the present invention;

FIGS. 18A and 18B show measured current-voltage and BVdss characteristics for an ET with a thick gate oxide made according to the present invention, respectively; and FIG. 18C shows measured threshold voltage and transconductance of the same ET as used for the measurements of FIGS. 18A and 181B.

Figures 2A, 2B:
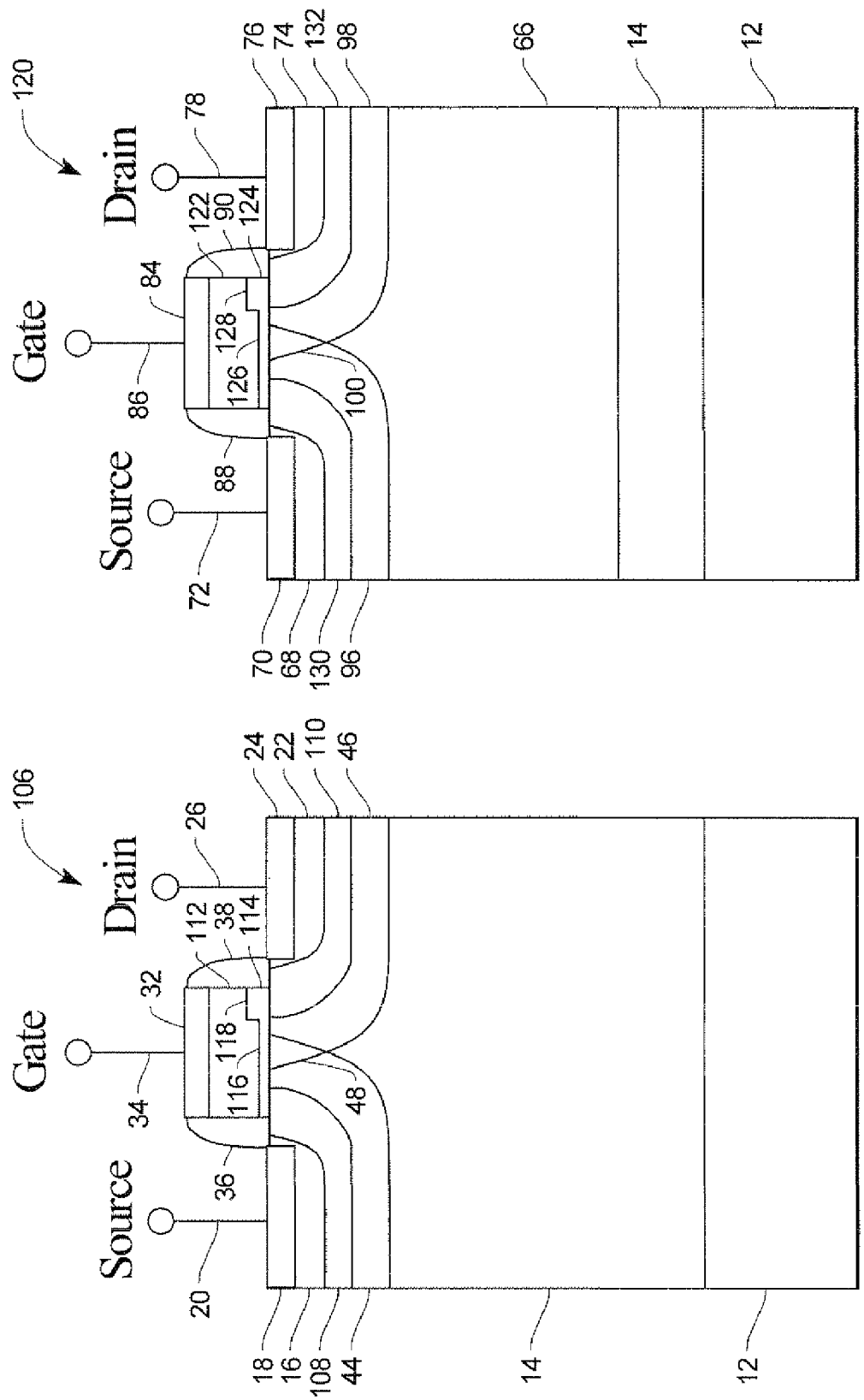
FIGS. 2A and 2B are diagrammatic views of other embodiments of the LV NMOS and the LV PMOS, respectively, shown in FIGS. 1A and 1B.

It will be appreciated that for purposes of clarity, and where deemed appropriate, reference numerals have been repeated in the figures to indicate corresponding features. Also, the relative size of various objects in the drawings has in some cases been distorted to more clearly show the invention. The examples set out herein illustrate several embodiments of the invention but should not be construed as limiting the scope of the invention in any manner.

DETAILED DESCRIPTION

Turning now to the drawings, FIG. 1A is a diagrammatic view of a low voltage (LV) N channel MOSFET (MOS) 10 which has a P+ substrate 12 with a P− epitaxial (epi) layer 14 deposited thereon. Formed in the epi layer 14 is an N+ source 16 which makes contact with a source silicide 18 positioned on top of the N+ source 16, and has a source contact 20 connected to it. Also formed in the epi layer 14 is an N+ drain 22 which makes contact with a drain silicide 24 positioned on top of the N+ drain 22, and has a drain contact 26 connected to it. Positioned horizontally between the source 16 and the drain 22 is a gate 28 with a gate oxide 30 between the epi layer 14 and the gate 28. A gate silicide 32 positioned above and connected to the gate 28 has a gate contact 34 connected to it. The gate 28 and gate oxide 30 have sidewall oxides 36 and 38 which extend horizontally at the top surface of the epi layer 14 to the source silicide 18 and the drain silicide 24.

Both the N+ source 16 and the N+drain 22 have two buffer layers formed below them that extend horizontally toward the drain 22 and the source 16, respectively. The upper buffer layer 40 under the source 16 and the upper buffer layer 42 under the drain 22 are N type regions which extend horizontally between the respective closest edges of the gate 28 and the middle of the gate 28 at the upper surface of the epi layer 14. The lower buffer layer 44, sometimes referred to herein as the lower bulk buffer layer 44, under the source 16 and the lower buffer layer 46, sometimes referred to herein as the lower bulk buffer layer 46, under the drain 22 are P type regions each of which extend horizontally past the center of the gate 28 such that the two layers 44 and 46 overlay each other to form a saddle region 48 under the gate 28.

FIG. 1B is the CMOS complement to FIG. 1A. FIG. 1B is a diagrammatic view of a low voltage (LV) P channel MOSFET (PMOS) 60 which has the P+ substrate 12 with the P− epi layer 14 deposited thereon and an N− tub 66 formed in the epi lay 14 which extends to the top surface of the epi layer 14. Also formed in the N− tub 66 in the epi layer 14 is a P+ source 68 which makes contact with a source silicide 70 positioned on top of the P+ source 68, and has a source contact 72 connected to it. Also formed in the N− tub 66 in the epi layer 14 is a P+ drain 74 which makes contact with a drain silicide 76 positioned on top of the P+ drain 74, and has a drain contact 78 connected to it. Positioned horizontally between the source 68 and the drain 74 is a gate 80 with a gate oxide 82 between the epi layer 14 and the gate 80. A gate silicide 84 positioned above and connected to the gate 80 has a gate contact 86 connected to it. The gate 80 and gate oxide 82 have sidewall oxides 88 and 90 which extend horizontally at the top surface of the epi layer 14 to the source silicide 70 and the drain silicide 76.

Both the P+ source 68 and the P+ drain 74 have two buffer layers formed below them that extend horizontally toward the drain 74 and the source 68, respectively. The upper buffer layer 92 under the source 68 and the upper buffer layer 94 under the drain 74 are P type regions which extend horizontally between the respective closest edges of the gate 80 and the middle of the gate 80 at the upper surface of the epi layer 14. The lower buffer layer 96, sometimes referred to herein as the lower bulk buffer layer 96, under the source 68 and the lower buffer layer 98, sometimes referred to herein as the lower bulk buffer layer 98, under the drain 74 are N type regions each of which extend horizontally past the center of the gate 80 such that the two regions 96 and 98 overlay each other to form a saddle region 100 under the gate 80.

Figure 11:
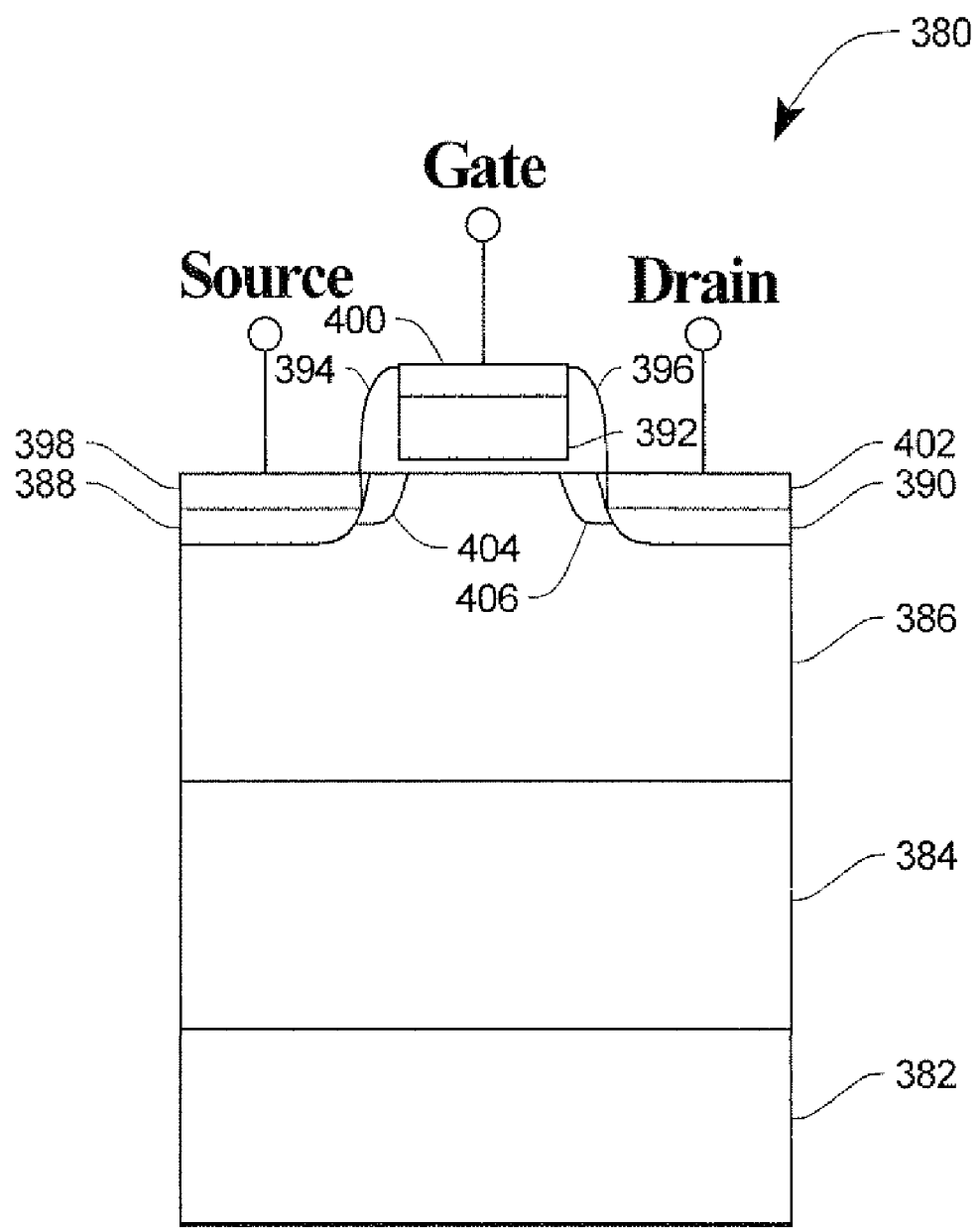
FIG. 11 is a diagrammatic view of a standard NMOS FET.

The LV NMOS and LV PMOS devices shown in FIGS. 1A and 1D provide improved operating characteristics compared to a standard short channel NMOS FET of the type shown in FIG. 11. These improved characteristics include one or more of the following: a higher punch-through voltage, a higher breakdown voltage ($BV_{dss}$), a lower on resistance ($R_{on}$), a lower drain to source capacitance ($C_{ds}$), a higher transconductance ($g_m$) a faster switching speed, and minimized degradation of $R_{on}$, $g_m$, and the drain saturation current ($I_{Dsat}$). The saddle shaped doping profiles 48 and 100 combined with the dual buffer layers 40, 44; 42, 46; 92, 96; and 94, 98 create graded doping profiles for the source/drain junctions to provide an improved punch through voltage and a higher $BV_{dss}$. The graded doping profiles also increase the drain and source depletion regions to provide a lower $C_{ds}$, which in tuna provides a faster switching speed. The depth and horizontal extension under the sidewall spacers 36, 38, 88, and 90 of the upper buffer layers 40, 42, 92, and 94 allow the channel electrons or holes to spread relatively deeply in the epi layers 14 to minimize hot carrier injection effects and thereby lessen the degradation of $R_{on}$, $g_m$, and $I_{Dsat}$, and to provide an effective small channel length for a low $R_{on}$. The low $R_{on}$, and the lower $C_{ds}$ provides an improved gun.

FIGS. 2A and 2B are the devices 10 and 60 shown in FIGS. 1A and 1B, respectively, with their gates and gate oxides modified to form split gate oxide devices 106 and 120, respectively. In FIG. 2A the LV NMOS device 106 has a gate 112 with a split gate oxide 114 with two thicknesses, a thin gate oxide section 116 under the portion of the gate 112 nearest the source 16, and a thick gate oxide section 118 under the portion of the gate 112 nearest the drain 22. Upper buffer layers 108 and 110 extend laterally further under the gate 112 then the corresponding upper buffer layers 40 and 42 in FIG. 1A. The upper buffer layer 110 under the drain 22 extends to approximately the boundary between the thin gate oxide section 116 and the thick gate oxide section 118. In FIG. 2B the LV PMOS device 120 has a gate 122 with a split gate oxide 124 with two thicknesses, a thin gate oxide section 126 under the portion of the gate 122 nearest the source 68, and a thick gate oxide section 128 under the portion of the gate 122 nearest the drain 74. Upper buffer layers 130 and 132 extend laterally further under the gate 124 then the corresponding upper buffer layers 92 and 94 in FIG. 1B. The upper buffer layer 132 under the drain 74 extends to approximately the boundary between the thin gate oxide section 126 and the thick gate oxide section 128.

The split gates 114, 124 reduce the Miller feedback capacitance due to the greater separation of the gates 112, 122 and the epi layers 14 at the thicker sections 118, 128 of the split gate oxides 114, 124 thus lowering the reverse transfer capacitance ($C_{rss}$). The split gates 112, 122 also reduce the HCI problems due to the reduced electrical field between the gates 112, 122 and the drains 22, 74, respectively. Since the effective channel length is reduced to the length of the thinner sections 116, 126 of the split gate oxides 114, 124, there is an improvement in the gill due to the lower gate charge required to turn on the devices 106, 120.

In device 10 of FIG. 1A, device 60 of FIG. 1B, device 106 of FIG. 2A, and device 120 of FIG. 2B buffer layers 40, 42, 44, 46, 92, 94, 96, 98, 108, 110, 130 and 132 are implanted self-aligned to the gates 28, 80, 112, and 122. The sources 16, 68, the source silicides 18, 70, the drains 22, 74, and the drain silicides 24, 76 are formed self-aligned to the gate side wall oxides 36, 38, 88, and 90. Both the upper and lower buffer layers in the NMOS devices 10 and 106 use the same mask for both the N type doping and the P type doping, which may be by ion implantation. Similarly, both the upper and lower buffer layers in the PMOS devices 60 and 120 use the same mask for both the P type doping and the N type doping. Therefore, only two masks are required to form the buffer layers in a CMOS device.

FIGS. 3A and 3B show middle voltage (MV) versions 134 and 136, respectively, of the devises 10, 60 of FIGS. 1A and 1B. In FIGS. 3A and 3B the sources 16, 68 and the drains 22, 74 have been spaced laterally with respect to the gates 28, 80. As a result, in FIG. 3A the upper buffer layer 138 and the lower buffer layer 140 under the source 16 form a resurf region 142 between the source 16 and the gate 28. Similarly, the upper buffer layer 144 and the lower buffer layer 146 under the drain 22 form a resurf region 148 between the drain 22 and the gate 28. In FIG. 3B the upper buffer layer 150 and the lower buffer layer 152 under the source 68 form a resurf region 154 between the source 68 and the gate 80. Similarly, the upper buffer layer 156 and the lower buffer layer 158 under the drain 74 form a resurf region 160 between the drain 74 and the gate 80. Although the devices 134, 136 in FIGS. 3A and 3B have resurf regions 142, 148, 154, and 160 on both sides of the gates 28 and 80 suitable for applications in which the polarities of the voltages applied to the drains and sources may switch polarities, in applications in which the drain voltage is always greater than the source voltage, the sources would not need to be spaced laterally from the gates thus reducing the size of the devices.

Figures 4A, 4B:
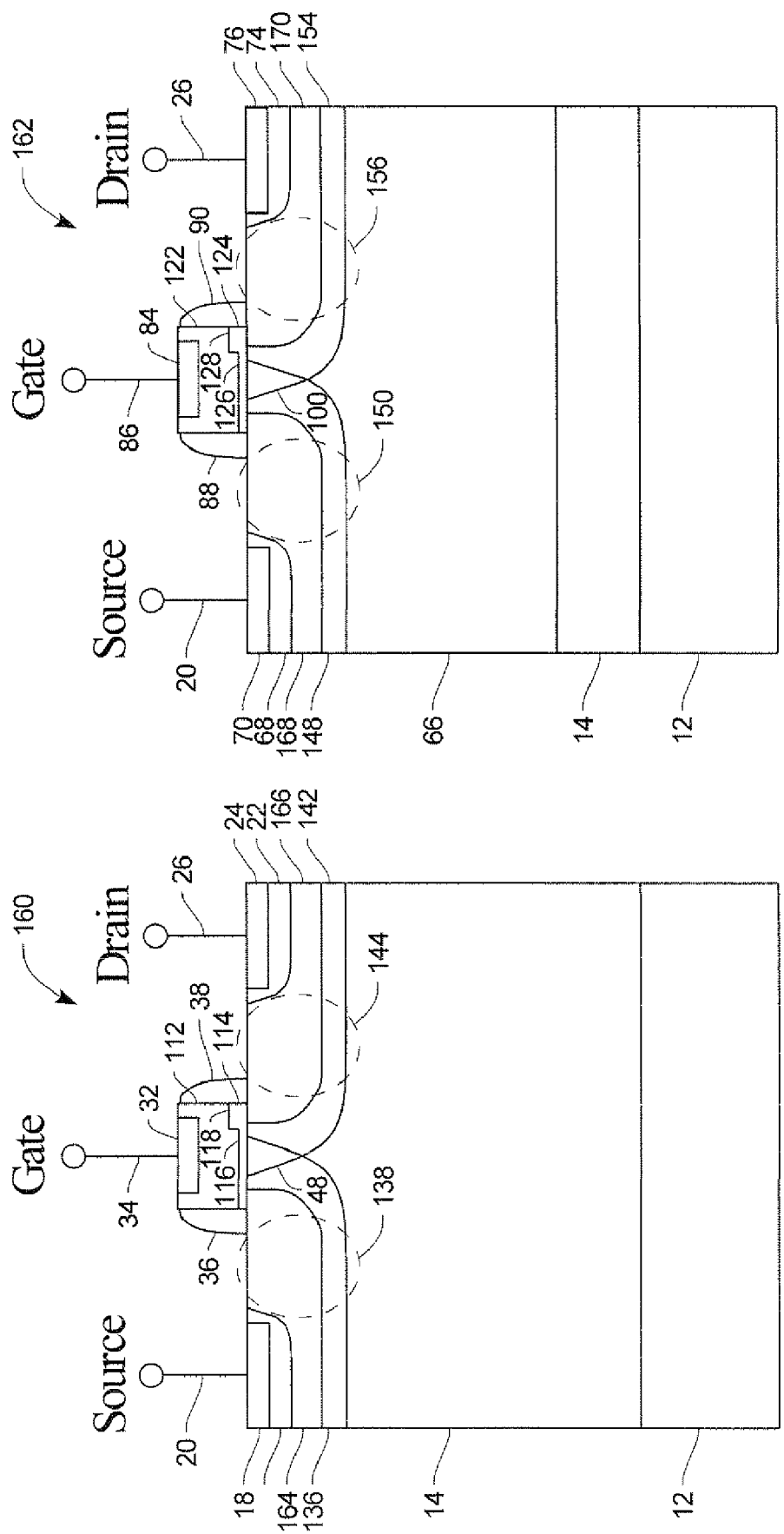
FIGS. 4A and 4B are diagrammatic views of other embodiments of the MV NMOS and the MV PMOS, respectively, shown in FIGS. 3A and 3B.

Devices 160 and 162 in FIGS. 4A and 4B, respectively, are the devices 134 and 136 of FIGS. 3A and 3B with split gate oxides 114 in FIGS. 4A and 124 in FIG. 4B, with upper buffer layers 164 and 166 in FIG. 4A, and with upper buffer layers 168 and 170 in FIG. 4B. The upper buffer layers 164, 166, 168, and 170 extend further under their respective gates 114, 124 than the upper buffer layers 138, 144, 150, and 156, respectively, in FIGS. 3A and 3B. The upper buffer layer 166 under the drain 22 in FIG. 4A extends laterally to approximately the boundary between the thin oxide section 116 and the thick oxide section 118. Similarly, the upper buffer layer 170 under the drain 74 in FIG. 4B extends laterally to approximately the boundary between the thin oxide section 126 and the thick oxide section 128.

The resurf regions 142, 148, 154, and 160 allow for higher doping concentrations in the upper buffers 138, 144, 150, and 156 or shorter separations between the gates and the sources and drains compared to conventional NMOS and PMOS transistors which lack a resurf type of drift region.

Figure 5A:
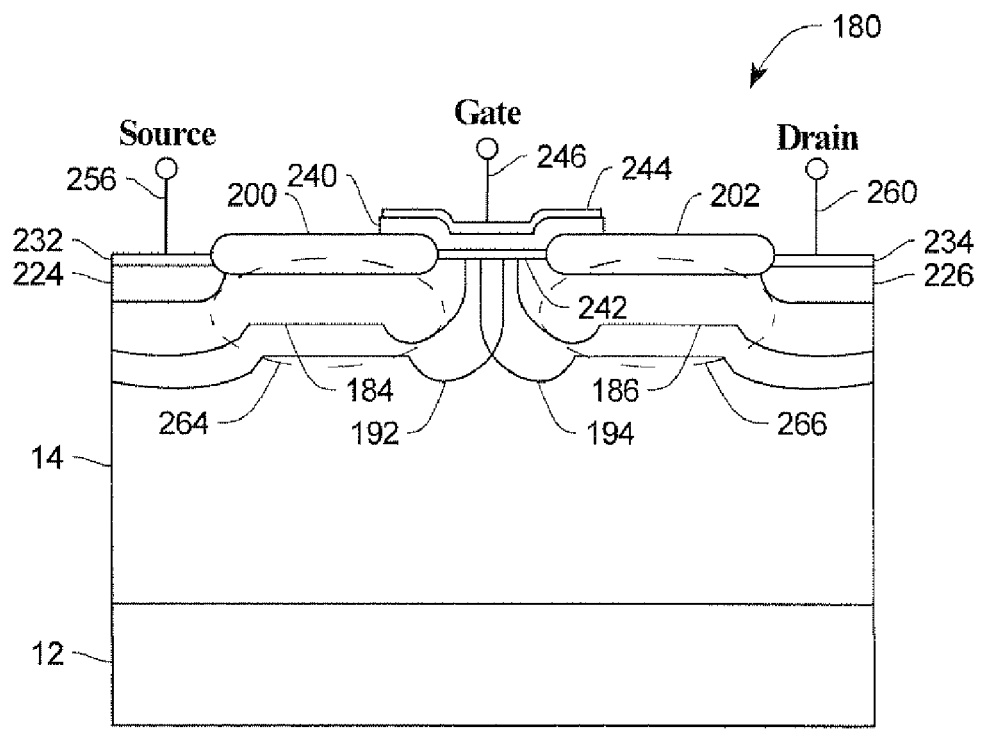
FIGS. 5A and 5B are diagrammatic views of a high voltage (HV) N channel MOSFET (NMOS) and a HV P channel MOSFET (PMOS), respectively, according to the present invention.
Figure 5B:
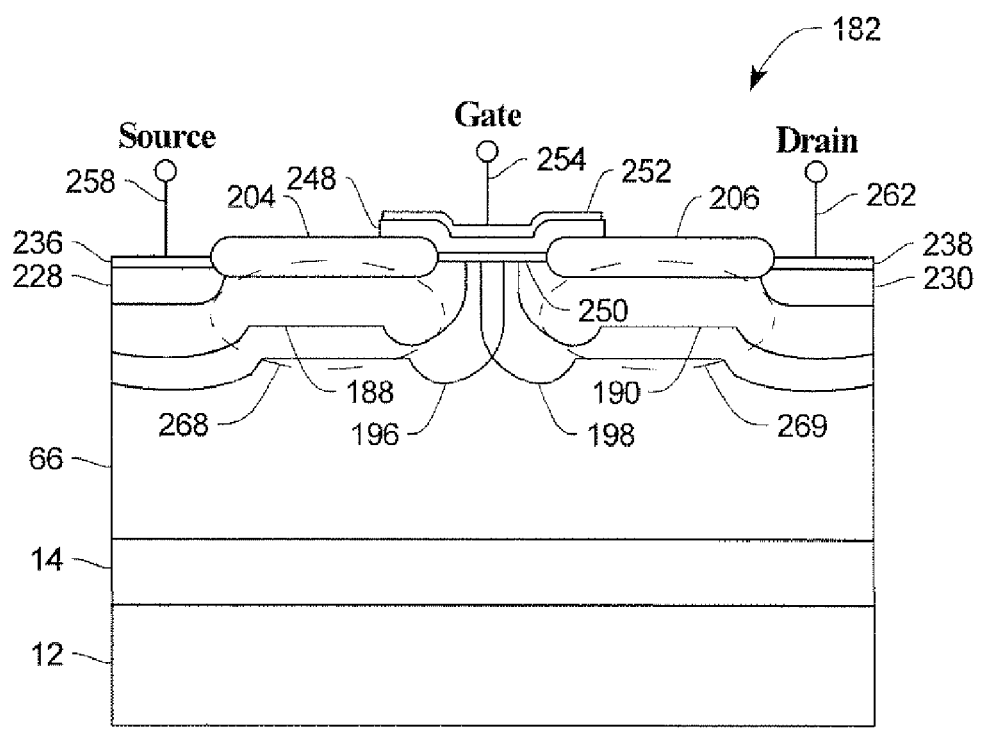

FIGS. 5A and 5B show high voltage (MV) versions 180 and 182, respectively, of the devises 10, 60 of FIGS. 1A and 1B. In fabricating the HV NMOS and MV PMOS devices shown in FIGS. 5A and 5B, upper buffer layers 184 and 186, lower buffers 192 and 194 in FIG. 5A and upper buffer layers 188 and 190, lower buffers 196 and 198 in FIG. 5B are formed for the device drift regions underneath field oxide region 200 and 202 in FIG. 5A, and field oxide regions 204 and 206 in FIG. 5B. These buffer layers are formed by high energy implantations, that can go through the field oxide, therefore, there are differential junction depths for the upper buffer layers or lower buffer layers that are related to the buffer layers located at the device source/drain and gate areas or underneath field oxide. The sources and drains 224 and 226, respectively, in FIG. 5A and the sources and drains 228 and 230, respectively, in FIG. 5B are also formed using the field oxides as masks. A source silicide 232 is formed over the source 224 and a drain silicide 234 is formed over the drain 226 in FIG. 5A. A source silicide 236 is formed over the source 228 and a drain silicide 238 is formed over the drain 230 in FIG. 5B.

In FIG. 5A a gate 240 lies on a gate oxide 242 in the region between two field oxides 200, 202 and overlaps the field oxides. A gate silicide 244 lies on the gate 240 and has a gate contact 246. Similarly, in FIG. 5B a gate 248 lies on a gate oxide 250 in the region between two field oxides 204, 206 and overlaps the field oxides. A gate silicide 252 lies on the gate 248 and has a gate contact 254. In FIGS. 5A and 5B the source silicides 232, 236 have source contacts 256, 258, respectively, and drain silicides 234, 238 have drain contacts 260, 262, respectively.

Similar to FIGS. 4A and 4B resurf regions 264, 266, 268, and 269 are formed by the upper and lower buffer layers.

Figure 6:
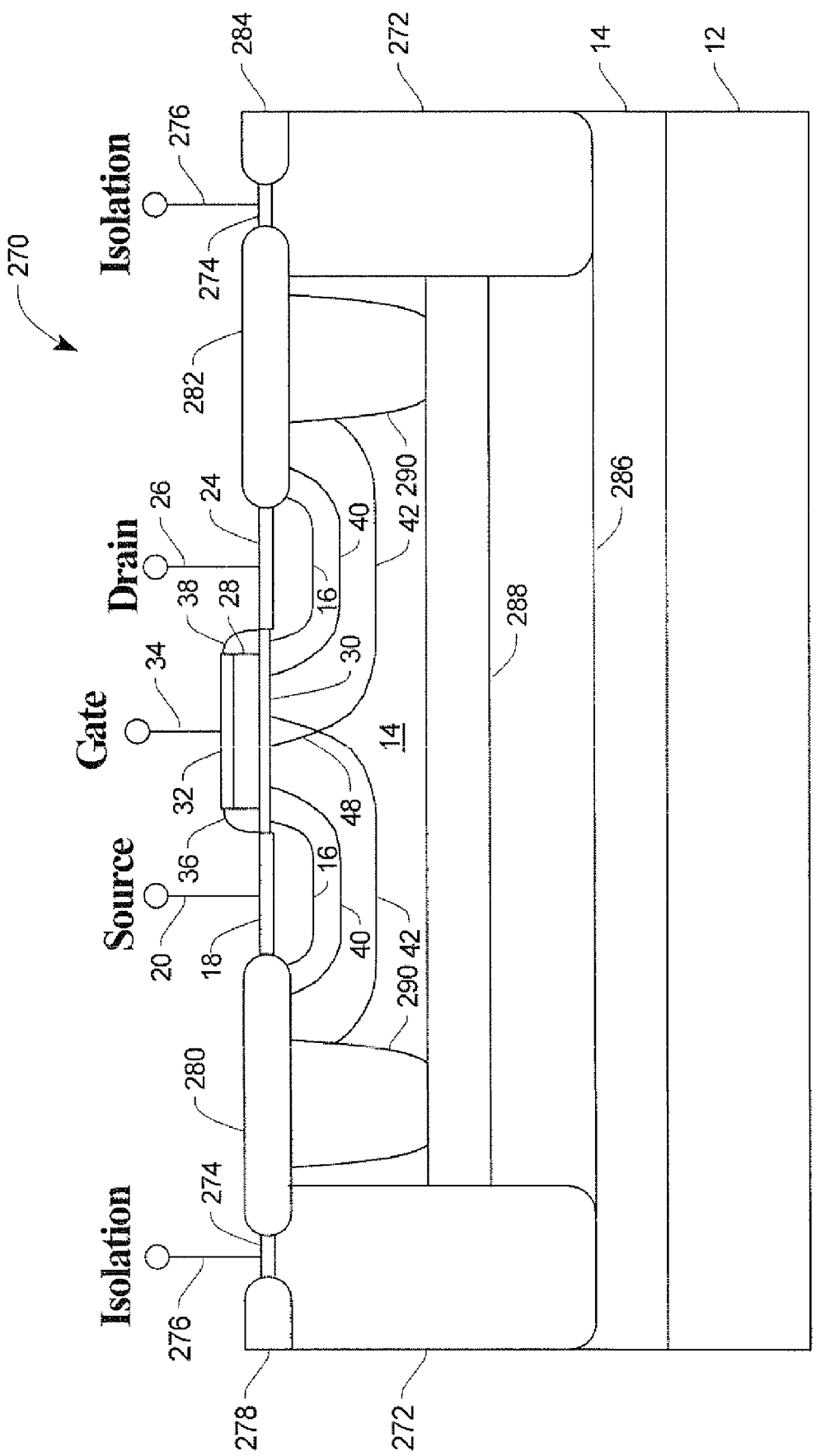
FIG. 6 is a diagrammatic view of an isolated LV NMOS.

FIG. 6 is a diagrammatic view of an isolated LV NMOS 270 which is placed inside an isolation ring 272 comprising an N sink. The isolation ring 272 has a plurality of silicide layers 274 on the surface of the N sink of the isolation ring 272 which, in turn, have isolation contacts 276. Field oxide regions 278, 280, 282, and 284 lie over the N sink of the isolation ring 272 in the regions outside the silicide layers 274. Formed in the P epi layer 14 is an N buried layer 286 which extends across the isolation ring and a P⁻ bottom layer 288 which lies on top of the N buried layer 286 and also extends across the isolation ring 272. A second isolation ring is shown in FIG. 6 as a pair of P⁻ wells 290 are formed under the field oxide regions 280 and 282 and extend from the top surface of the P⁻ epi layer 14 to the bottom layer 288. The doping concentration of the P⁻ bottom layer 288 and the P⁻ wells 290 are approximately three orders of magnitude greater than the doping concentration of the P⁻ epi layer 14.

Figure 7:
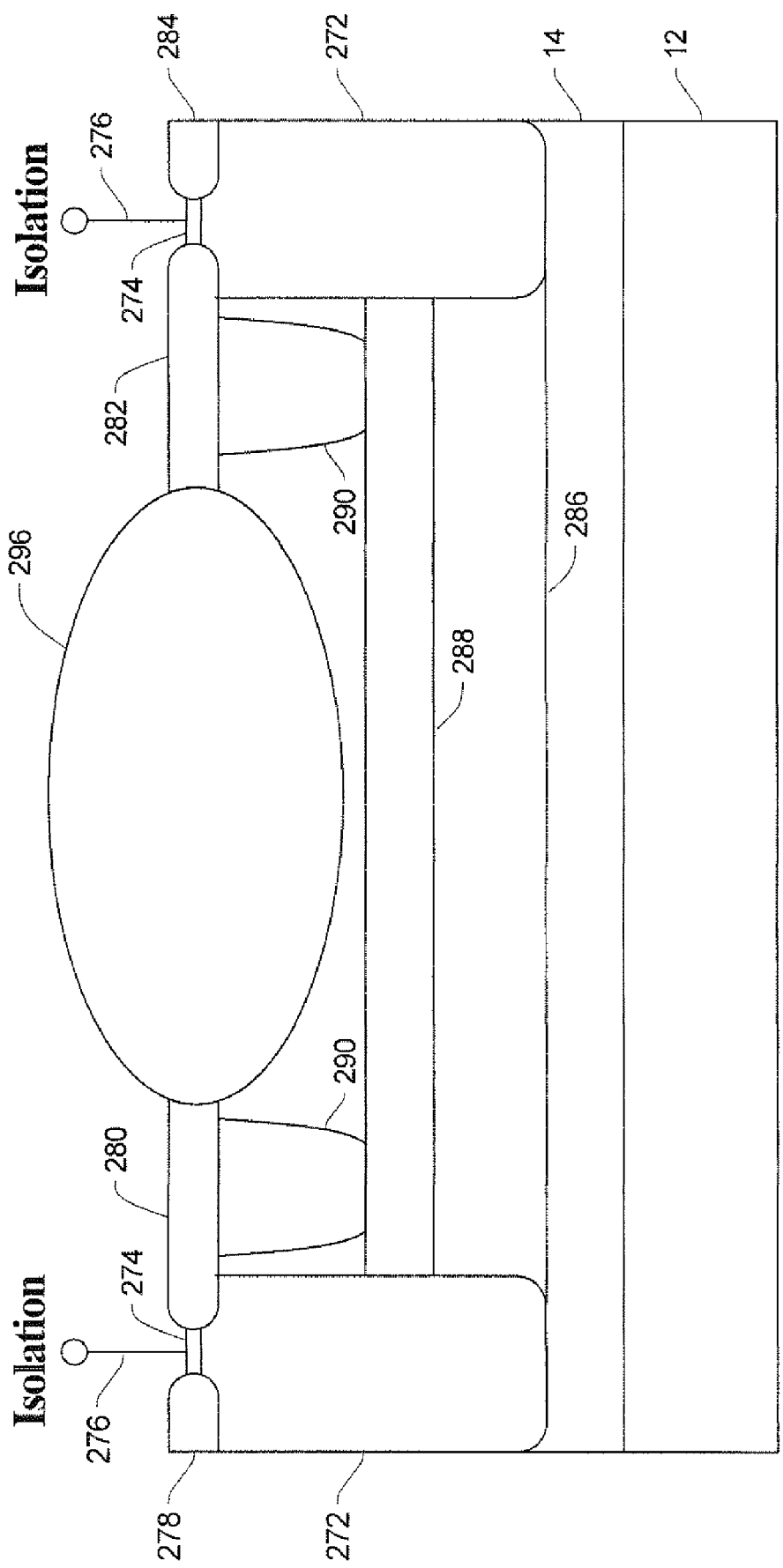
FIG. 7 is a diagrammatic view of an isolation region for an MV or HV NMOS.

The same isolation structure, although necessarily expanded horizontally, can be used with the MV NMOS devices and the I-V NMOS devices as shown in FIG. 7 where the MV NMOS devices and the HV NMOS devices would be inserted in the oval 296.

Figure 8:
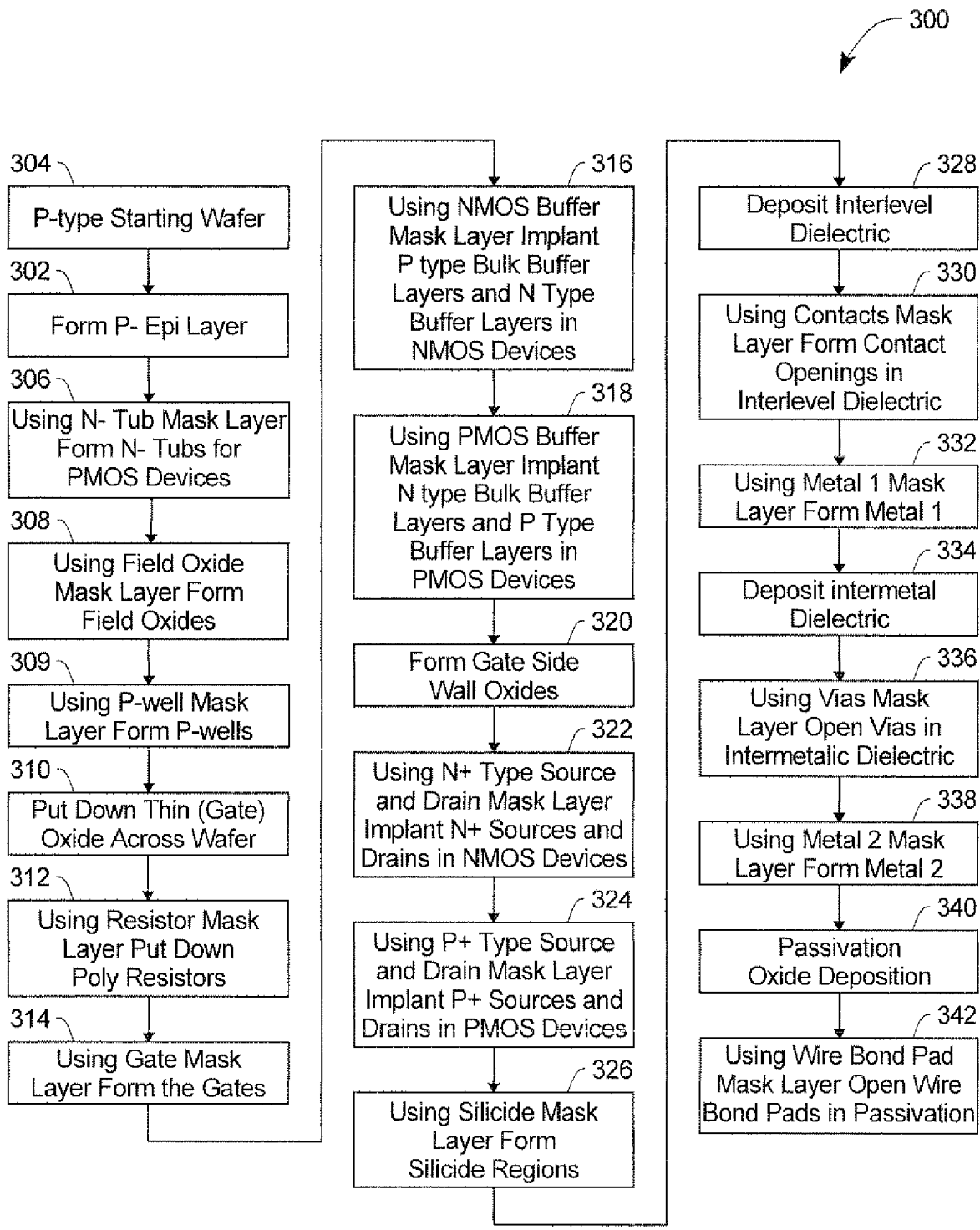
FIG. 8 is a flow chart of the principal processing steps which may be used to form a complementary MOS (CMOS) device according to the present invention.

FIG. 8 is a sequential listing 300 of the principal processing steps used in an embodiment of the present invention to form the complementary MOSFETs 10, 60 and 134, 136 of FIGS. 1A, 1B, 3A and 3B, respectively. In order to avoid unnecessary clutter, the following recitation of the process steps will generally refer to the reference numbers in FIGS. 1A and 1B only. As shown in FIG. 8 the P− epi layers 14 are formed by deposition on a P− type starting wafer or substrate 12 as indicated in boxes 302 and 304, respectively. In the P MOSFETs the N− tubs 66 are implanted into the epi layer 14 using N− tub mask layers as indicated in box 306. Then the field oxides (like the field oxides 200, 202, 204, 206 in FIGS. 5A and 5B) are grown as indicated in box 308. The P-wells 290 (sometime called channel stop layers) are formed following the field oxide process to support isolation between devices in the technology. The P-wells 290 are also used for part of the p-type isolation rings for the isolated device architectures (FIG. 6 and FIG. 7). A thin oxide layer, parts of which will become the gate oxides, is formed on the wafer as indicated in box 310 followed by the deposition and masking of the poly resistors on the field oxides using the resistor mask layer as indicated in box 312. Using a gate mask layer the poly gates 28, 80 are formed on the thin oxide layer as indicated in box 314.

The NMOS lower bulk buffer layers 44, 46 and the upper buffer layers 40, 42 are implanted using an NMOS buffer mask layer as indicated in box 316, followed by the implantation of the PMOS lower bulk buffer layers 96, 98 and the upper buffer layers 92, 94 using a PMOS buffer mask layer as indicated in box 318. The gate side wall oxides 36, 38, 88, and 90 are formed by covering the wafer with deposited silicon dioxide and anisotropically etching the silicon dioxide as indicated in box 320. The NMOS sources and drains 16, 22 are implanted using a N+ mask layer as indicated in box 322, followed by the implantation of the PMOS sources and drains 68, 74 using a P+ mask layer as indicated in box 324. The source silicides 18, 70, gate silicides 32, 84, and drain silicides 24, 76 are formed using the silicide mask layers as indicated in box 326.

An interlevel dielectric is deposited as indicated in box 328, and contact holes are formed using a contact mask layer as indicated in box 330. The first layer of metal is deposited and etched using a metal 1 mask layer as indicated in box 332, over which an intermetal dielectric is deposited as indicated by box 334 and etched using a vias mask layer as indicated in box 336. A second layer of metal is deposited and etched using a metal 2 mask layer as indicated by box 338, followed by the deposition of a passivation layer as indicated by box 340, through which wire bond pads are exposed using a wire bond pad mask layer as indicated by box 342. (The structures formed by the processes indicated in boxes 328-342 are not shown in the drawings.)

As shown in FIG. 8 15 masking layers are used to form the two metal version fully silicide complementary MOSFETs partially shown in FIGS. 1A, 1B, 3A, and 3B, including the poly resistor masking layer.

Figure 9:
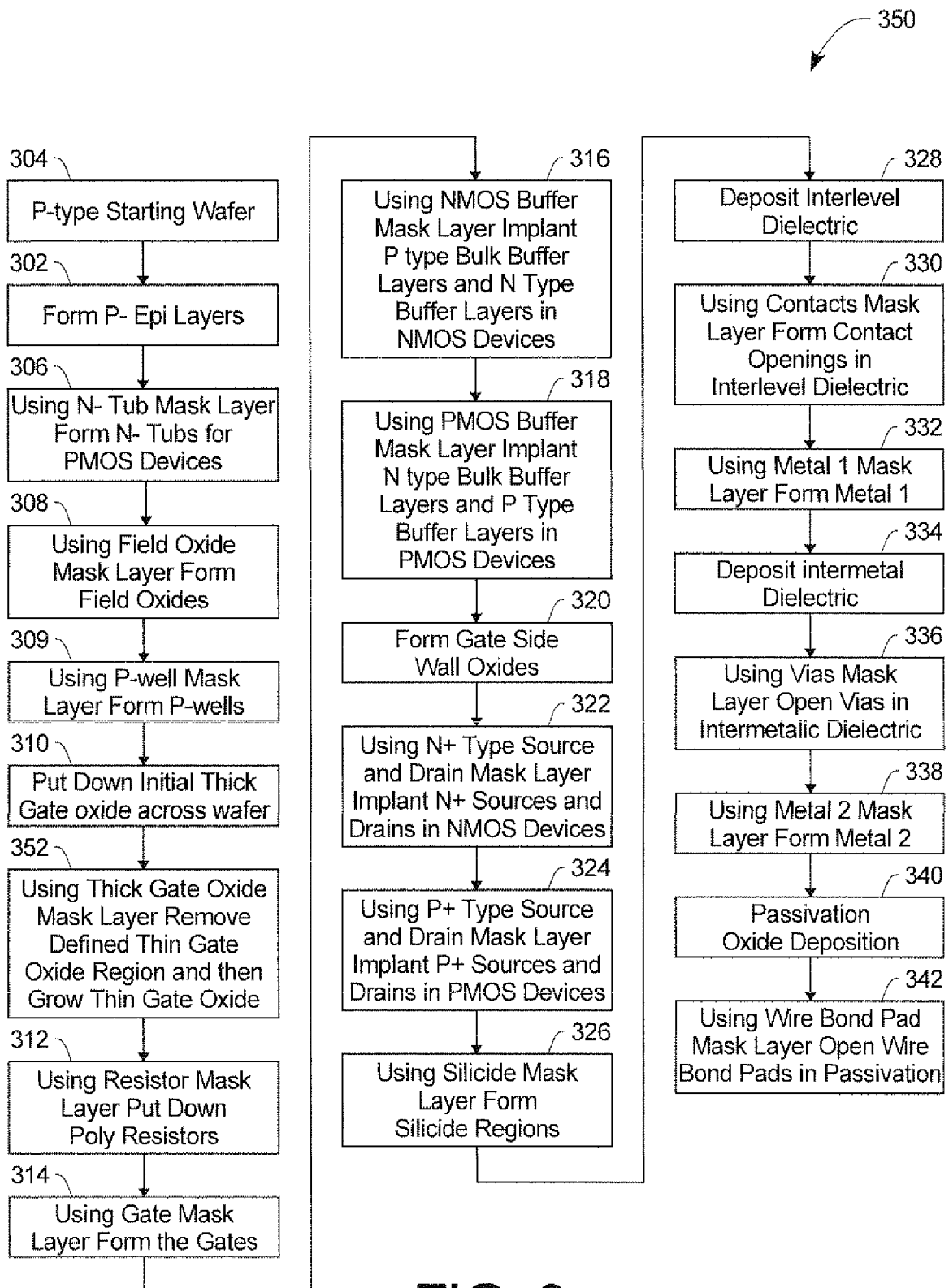
FIG. 9 is a flow chart of the principal processing steps which may be used to form a split gate oxide complementary MOS (CMOS) device according to the present invention.

FIG. 9 is a sequential listing 350 of the principal processing steps used in an embodiment of the present invention to form the complementary MOSFETs 10, 60; 134, 136; and 180, 182 of FIGS. 1A, 1B, 3A, 3B, 5A and 5B, respectively, and the complementary MOSFETs 106, 120; and 160, 162 of FIGS. 2A, 2B, 4A, and 4B. The process steps are the same as the process steps shown in FIG. 8 with the addition of using a thick gate oxide mask layer to grow a thick gate oxide as indicated in box 352. For the complementary MOSFETs of FIGS. 1A, 1B, 3A, 3B, 5A and 5B the thick oxide is used to form gate oxides that are thicker than the thin layer of oxide indicated in box 310. For the complementary MOSFETS of FIGS. 2A, 2B, 4A, and 4B the thick gate oxide indicated in box 352 is used to form the thick side of the split gate oxides 114 and 124.

Figure 10:
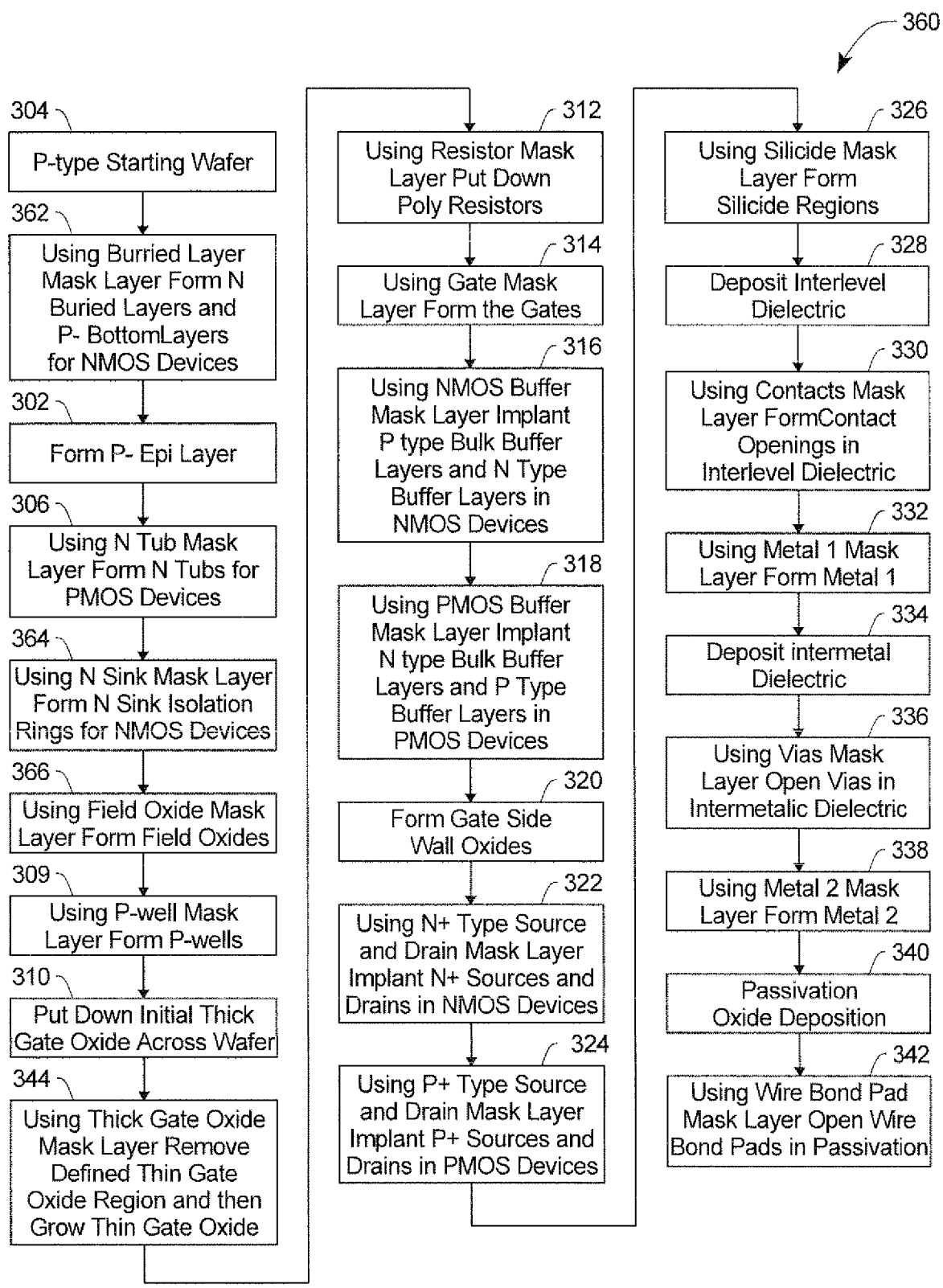
FIG. 10 is a flow chart of the principal processing steps which may be used to form a complementary MOS (CMOS) device with isolated NMOS FETs according to the present invention.

FIG. 10 is a sequential listing 360 of the principal processing steps used in an embodiment of the present invention to form the isolated NMOS FETs shown in FIGS. 6 and 7. As shown in FIG. 10 the additional processing step of forming the N buried layers 286 and the P− buried layers 288 using a buried layer mask layer as indicated by box 362 has been added to the processing steps in FIG. 9. Also added is the step of adding the N sink isolation rings 272 as indicated in box 364.

FIG. 11 is a diagrammatical view of a standard NMOS device 380 which has a P⁺ substrate 382, a P⁻ epi layer 384, and a P well 386 which is formed in the epi layer 384 and extends to the upper surface of the epi layer 384. N⁺ source and drain regions, 388 and 390, respectively, are formed in the upper surface of the epi lay 384 and are on opposite sides of a gate 392 having gate sidewall oxides 394 and 396. A source silicide 398, a gate silicide 400, having a drain silicide 402 lie above the source 388, the gate 392, and the drain 390, respectively. Two shallow N low doped drain (LDD) regions 404 and 406 lie below the gate sidewall oxides 394 and 396, respectively, and contact the source 388 and the drain 390, respectively.

Figure 12B:
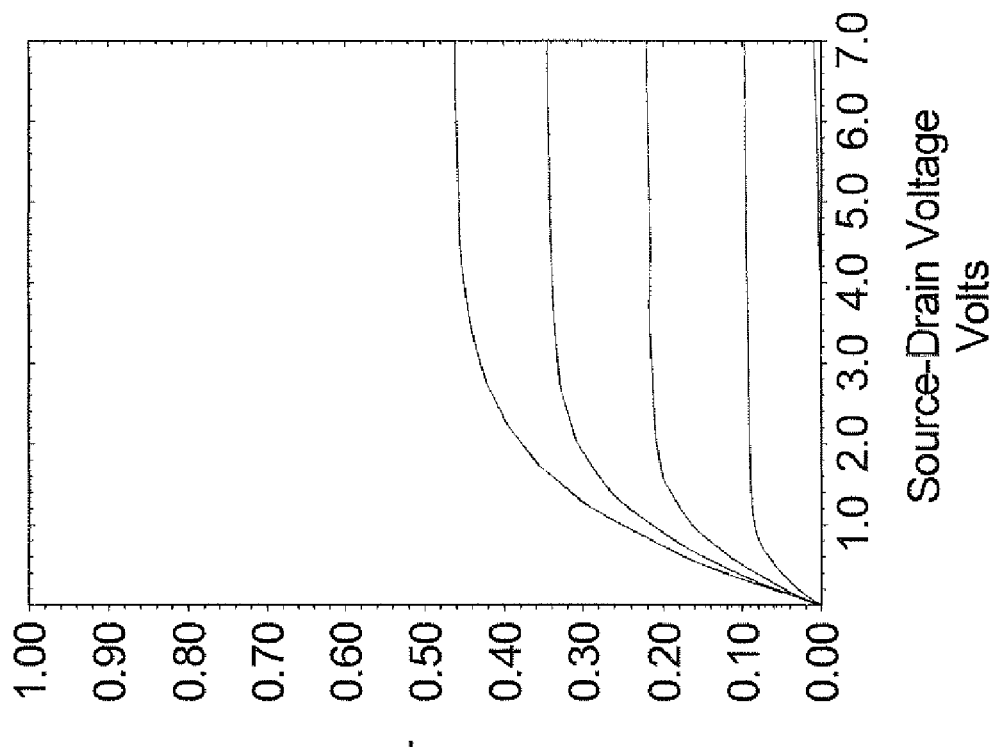
FIGS. 12A and 12B show simulated drain current density characteristics for a LV NMOS of the present invention and the standard NMOS FET of FIG. 11, respectively.
Figure 12A:
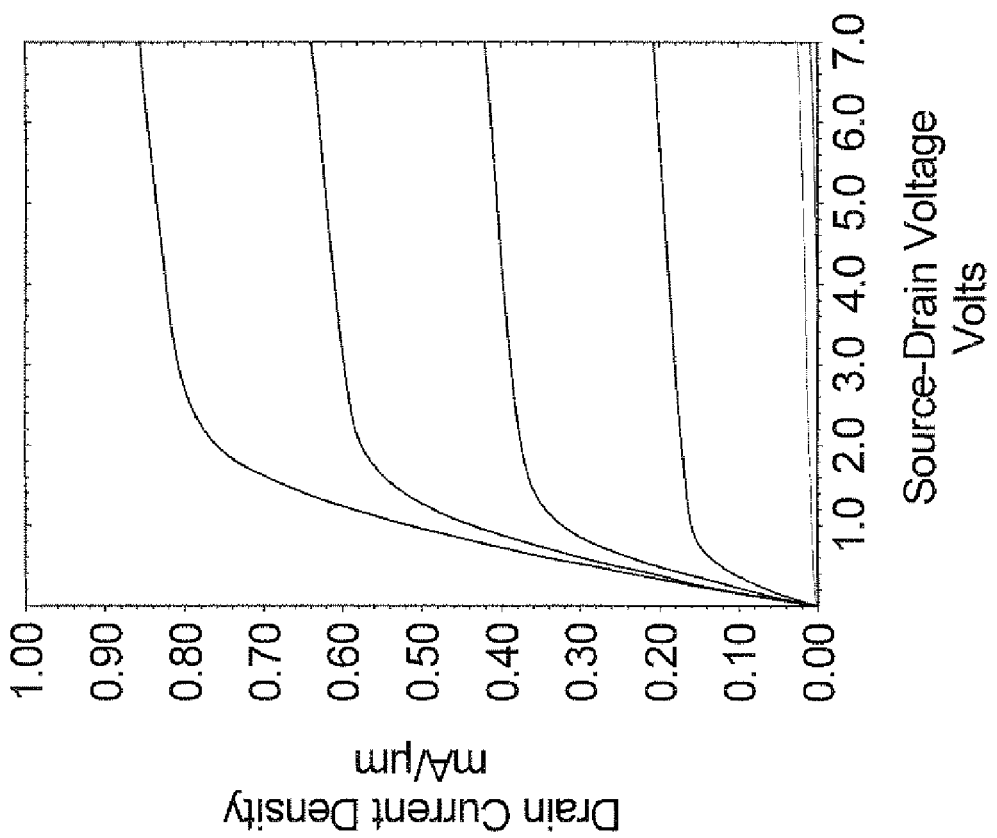
Figure 13B:
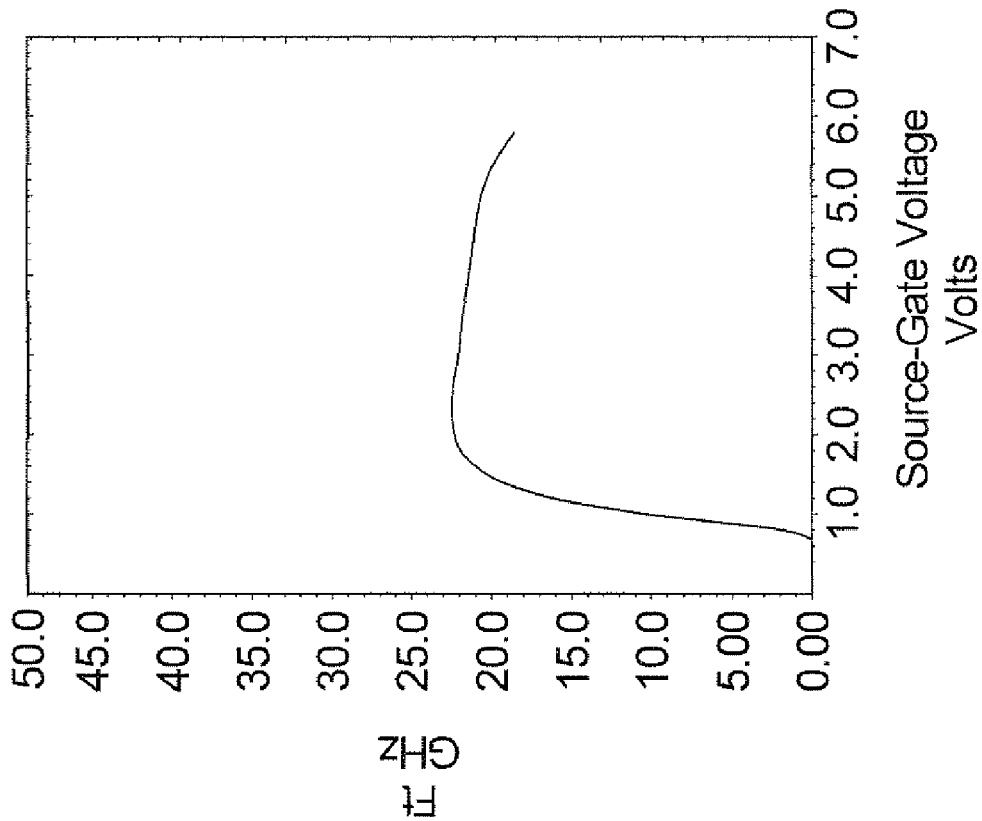
FIGS. 13A and 13B show simulated frequency transition (Ft) characteristics for a LV NMOS of the present invention and the standard NMOS FET of FIG. 11, respectively.
Figure 13A:
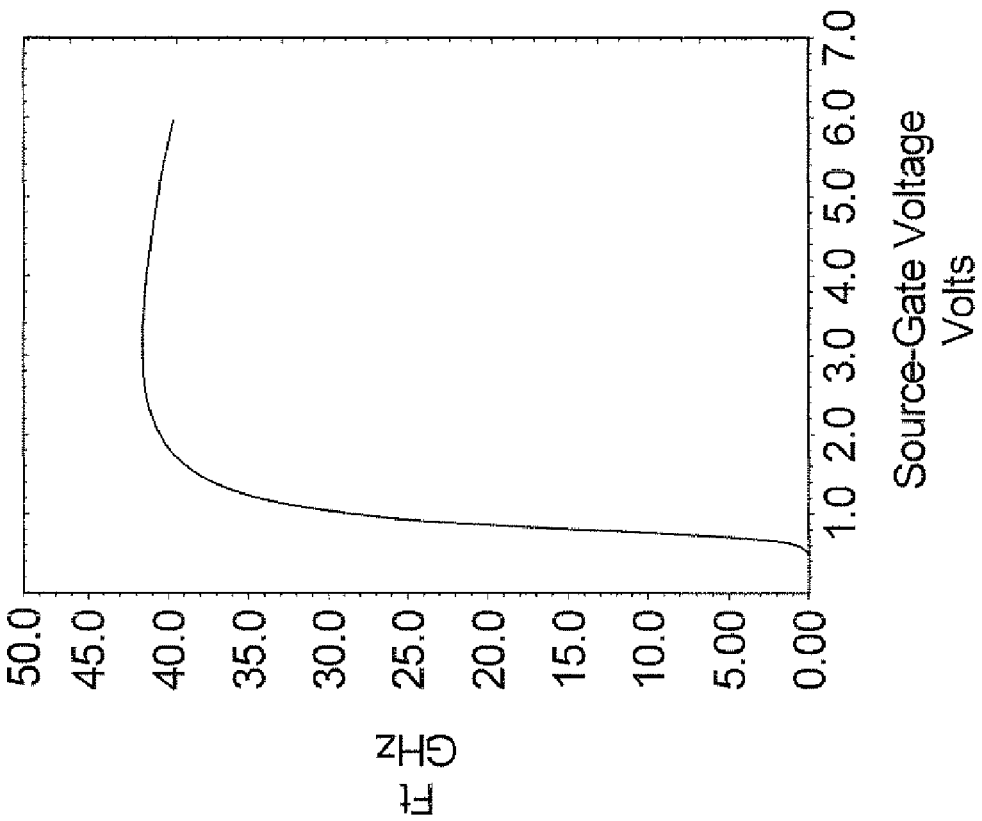
Figure 14B:
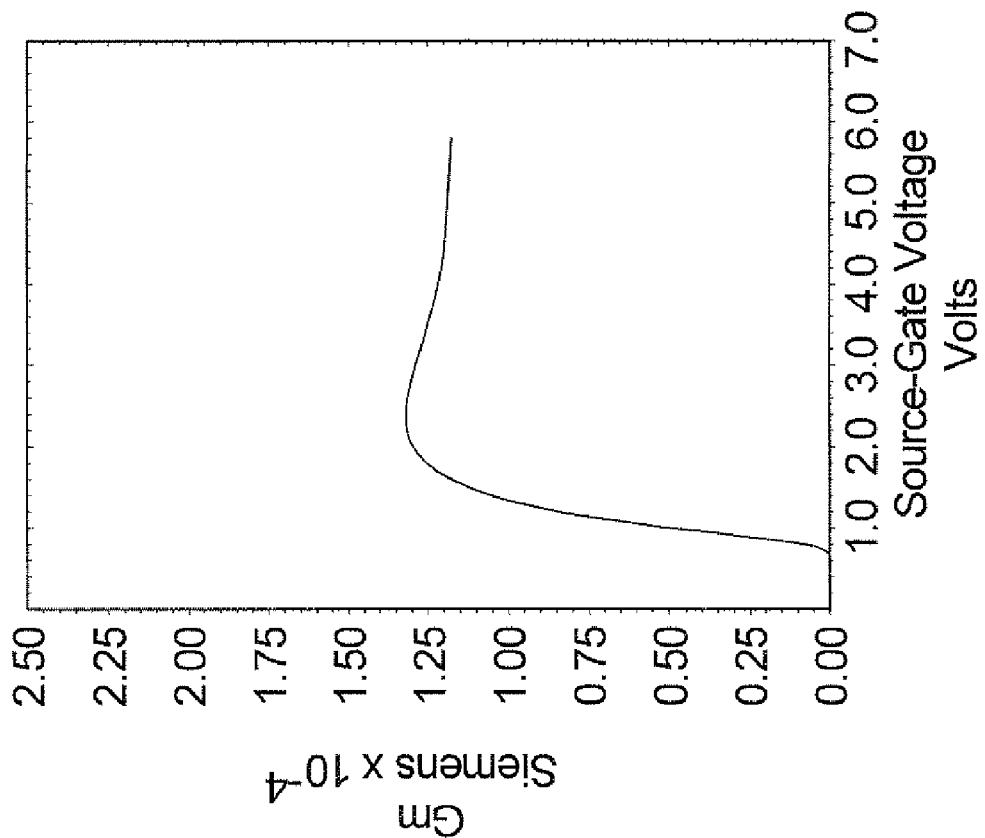
FIGS. 14A and 14B show simulated transconductance characteristics for a LV NMOS of the present invention and the standard NMOS FET of FIG. 11, respectively.
Figure 14A:
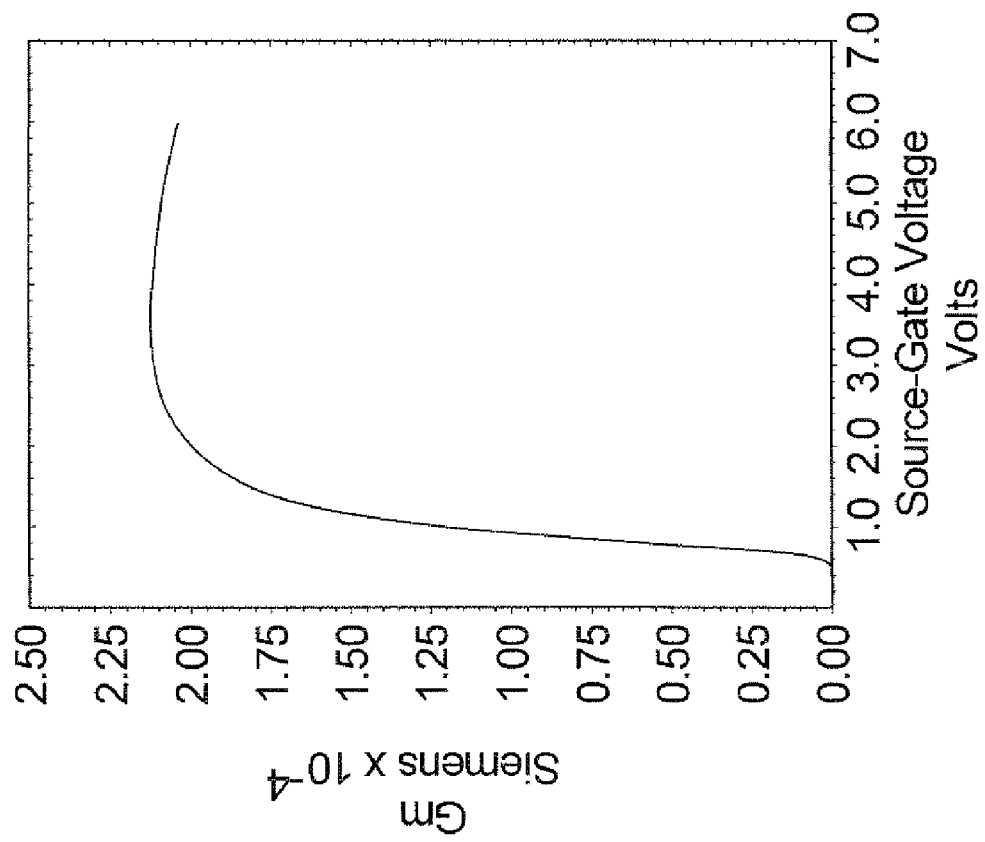

FIGS. 12A, 13A, 14A, 15A, and 16A show 2-D simulated Si level operational characteristics of a 5 volt LV NMOS FET 10 of the type shown in FIG. 1 with a 0.35 micron gate length, and FIGS. 12B, 13B, 14B, 15B, and 16B show 2-D simulated Si level operational characteristics of a standard 5 volt NMOS FET 380 of the type shown in FIG. 11. FIGS. 12A and 12B show the calculated drain characteristics for the respective transistors. As can be seen the NMOS FET 10 has higher drain current densities than the standard NMOS FET 380. The NMOS FET 10 has a peak 2-D drain current density of 0.853 mA/micron with a $BV_{dss}$ of 8V, while the standard NMOS FET 380 has a peak drain current density of 0.462 mA/micron also with a $BV_{dss}$ of 8V, representing a 85% increase in the drain current density. FIGS. 13A and 13B show the calculated frequency transitions (Ft) for the respective intrinsic transistors. As can be seen the NMOS FET 10 has a higher Ft than the standard NMOS FET 380. The NMOS FET 10 has a peak Ft of 43 GHz, while the standard NMOS FET 380 has a peak Ft of 23 GHz, representing a 1.87 times faster Ft. FIGS. 14A and 14B show the calculated transconductance for the respective intrinsic transistors. As can be seen the NMOS FET 10 has a higher transconductance than the standard NMOS FET 380 the NMOS FET 10 has a peak transconductance of $2.20 \times 10^{-4}$ siemens, while the standard NMOS FET 380 has a peak transconductance of $1.35 \times 10^{-4}$ siemens, representing a 63% increase in the transconductance.

Figure 15B:
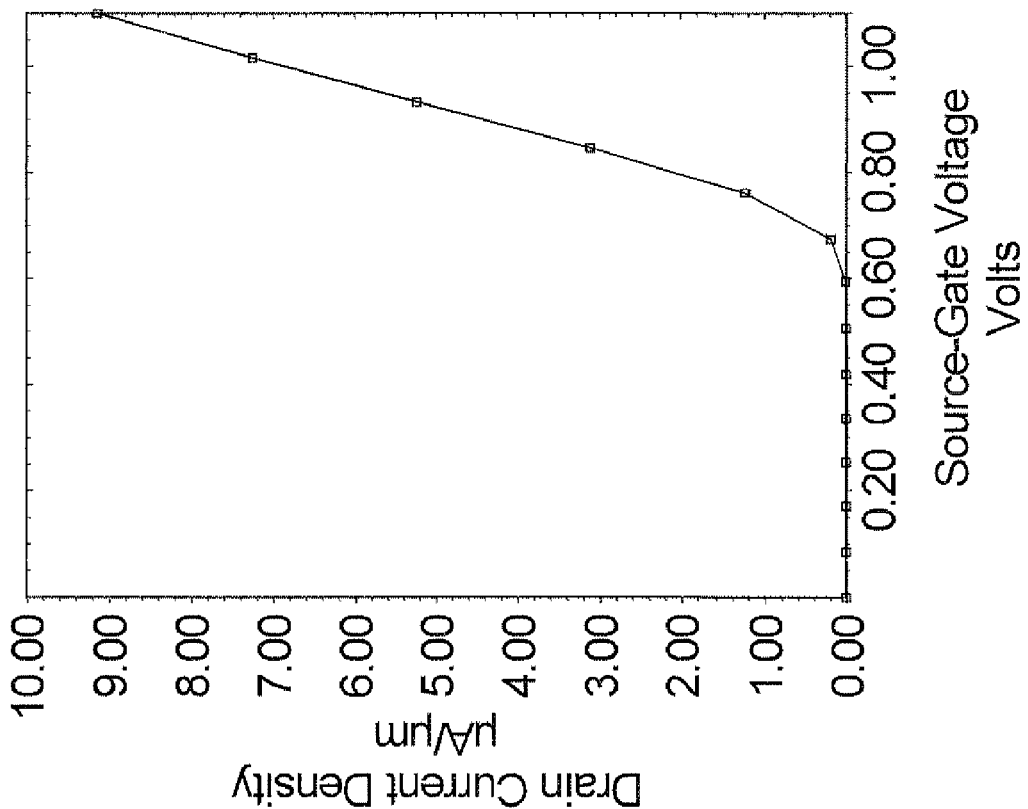
FIGS. 15A and 15B show simulated threshold voltage characteristics for a LV NMOS of the present invention and the standard NMOS FET of FIG. 11, respectively.
Figure 15A:
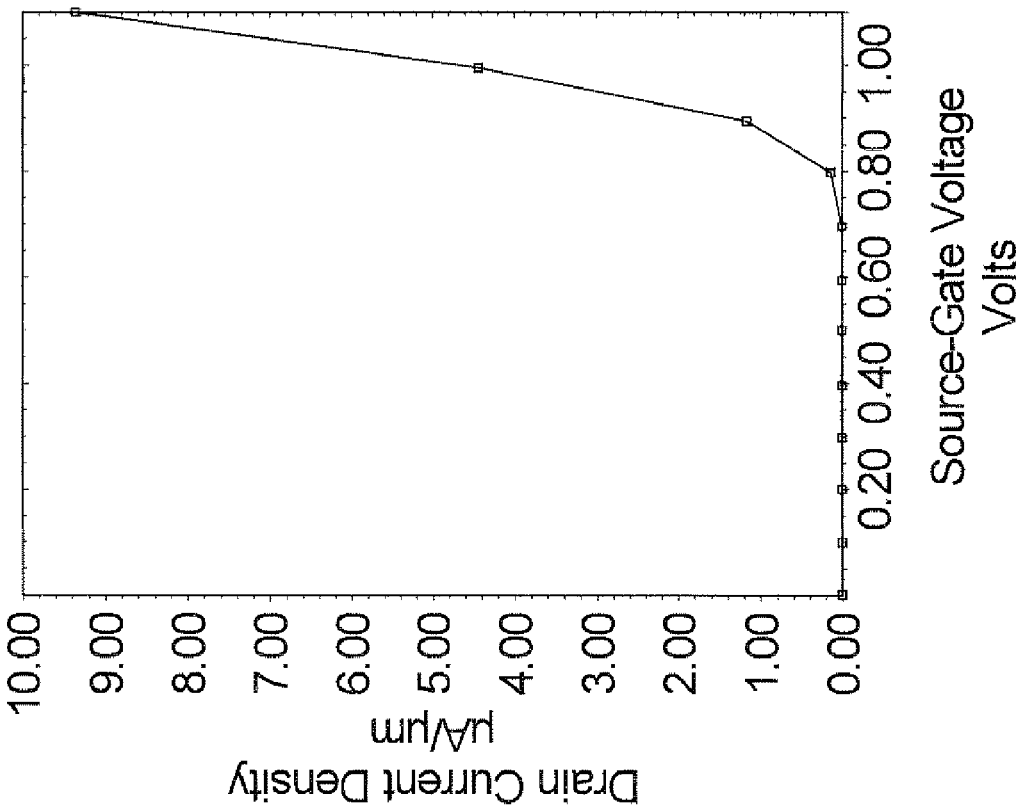
Figure 16B:
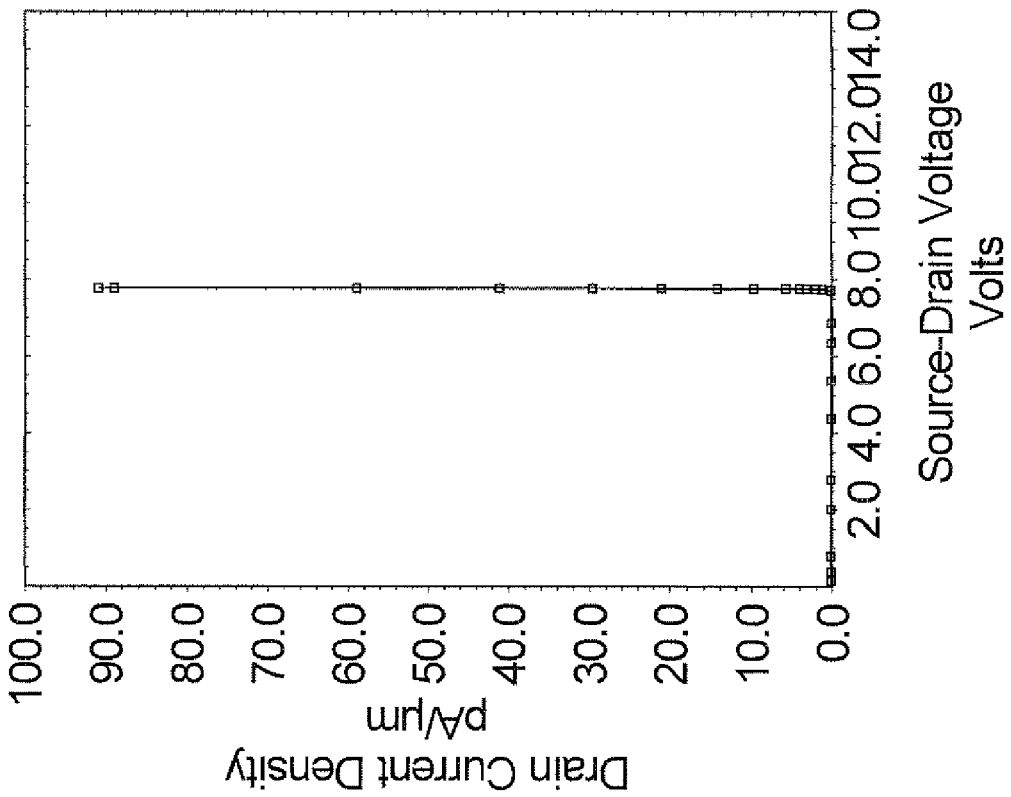
FIGS. 16A and 16B show simulated breakdown voltage ($BV_{dss}$) characteristics for a LV NMOS of the present invention and the standard NMOS FET of FIG. 11, respectively.
Figure 16A:
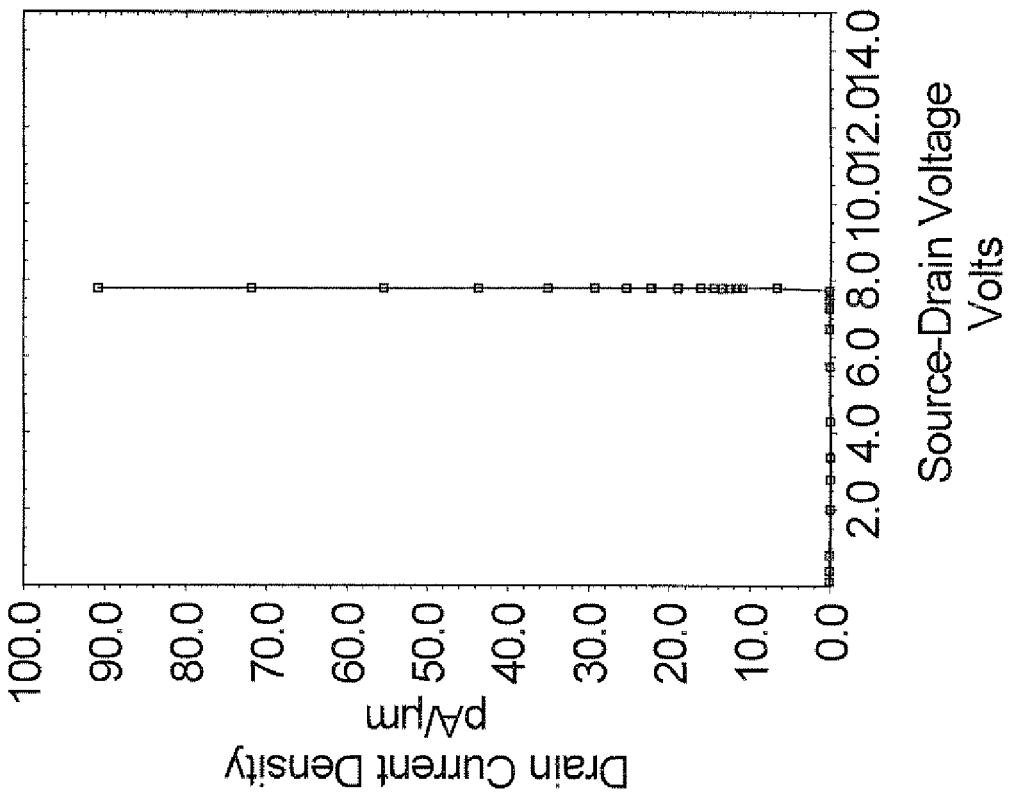

FIGS. 15A and 15B show that both devices have a threshold voltage of 0.7V with a gate oxide of 115 Å. FIGS. 16A and 16B show that both devices have a $BV_{dss}$ of around 8V.

Figure 17A:
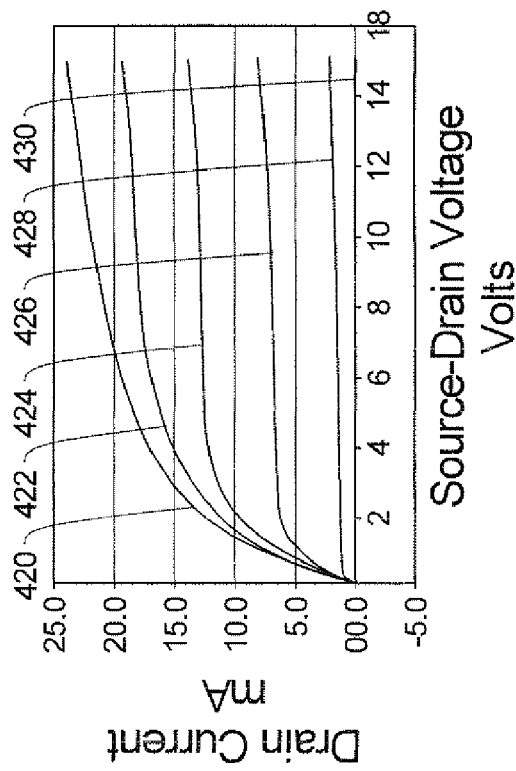
FIGS. 17A and 17B show measured current-voltage and $BV_{dss}$ characteristics for an experimental transistor (ET) with a thin gate oxide made according to the present invention, respectively.
Figure 17C:
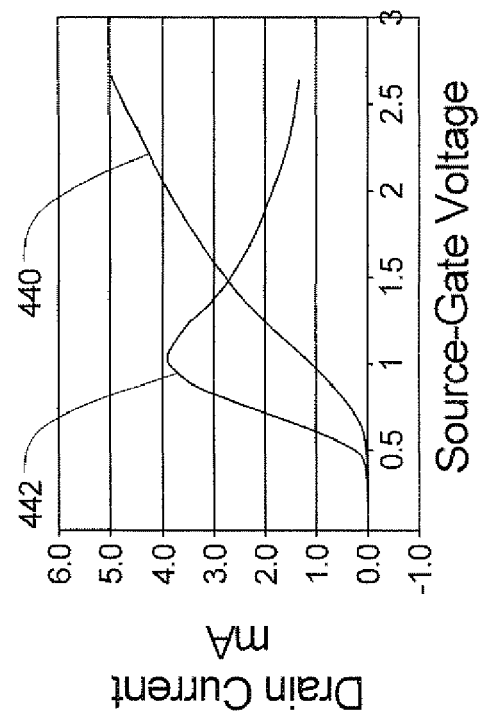
FIG. 17C shows measured threshold voltage and transconductance of the same ET as used for the measurements of FIGS. 17A and 17B.
Figure 17B:
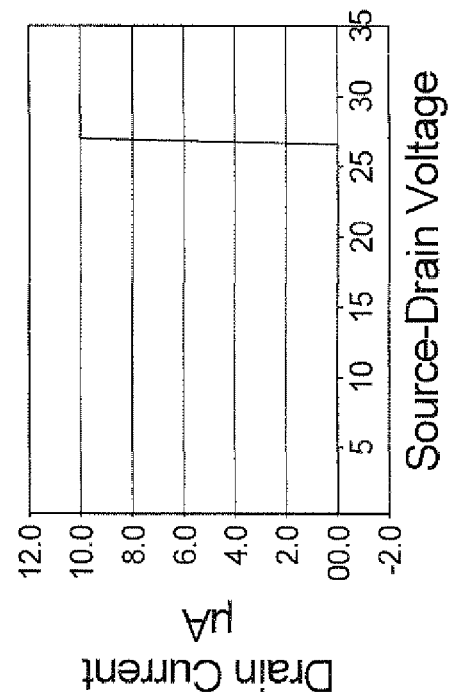

FIGS. 17A-18C show experimental transistor (ET) data for an MV NMOS FET 134 of the type shown in FIG. 3A. FIGS. 17A-17C are the measured characteristics of an ET with a thin gate oxide (115 Å) having a Rsp, on of around 24.6 mOhm·mm² at a $BV_{dss}$ of 26.8V. In FIG. 17A curve 420 shows the measured drain current versus drain to source voltage characteristics for a gate to source voltage (Vgs) of 5V, curve 422 is for a Vgs of 4V, curve 424 is for a Vgs of 3V, curve 426 is for a Vgs of 2V, curve 428 is for a Vgs of 1V, and curve 430 is for a Vgs of 0V. FIG. 17B shows the measured breakdown voltage characteristics of the ET, and FIG. 17C shows the measured threshold voltage characteristics (curve 440) and the transconductance (curve 442) for the ET.

FIGS. 18A-18C are the measured characteristics of an ET with a thick gate oxide (425 Å) having a Rsp, on of around 21.8 mOhm·mm² at a $BV_{dss}$ of 22.6V. In FIG. 18A curve 450 shows the measured drain current versus drain to source voltage characteristics for a gate to source voltage (Vgs) of 16V, curve 452 is for a Vgs of 14V, curve 454 is for a Vgs of 12V, curve 456 is for a Vgs of 10V, curve 458 is for a Vgs of 8V, curve 460 is for a Vgs of 6V, curve 462 is for a Vgs of 4V, and curve 464 is for a Vgs of 2V. FIG. 18B shows the measured breakdown voltage characteristics of the ET, and FIG. 18C shows the measured threshold voltage characteristics (curve 470) and the transconductance (curve 472) for the ET.

While the invention has been described with reference to particular embodiments, it will be understood by those skilled in the art that various changes may be made and equivalents may be substituted for elements thereof without departing from the scope of the invention. In addition, many modifications may be made to adapt a particular situation or material to the teachings of the invention without departing from the scope of the invention.

Therefore, it is intended that the invention not be limited to the particular embodiments disclosed as the best mode contemplated for carrying out this invention, but that the invention will include all embodiments falling within the scope and spirit of the appended claims.

The invention claimed is:

1. An N channel MOSFET (NMOS) comprising:
   a) a P⁻ epitaxial layer on a substrate;
   b) a source and a drain formed in said epitaxial layer and located on opposite sides of a gate lying on a gate which lies on said epitaxial layer;
   c) a first N type upper buffer layer extending from under said source laterally to a position between a first edge of said gate closest to said source at a top surface of said epitaxial layer and a middle of said gate;
   d) a second N type upper buffer layer extending from under said drain laterally to a position between a second edge of said gate closest to said drain at said top surface of said epitaxial layer and said middle of said gate;
   e) a first P type lower bulk layer extending from under said first N type buffer layer laterally to a position under said gate at said top surface of said epitaxial layer which is closer to said drain than to said source; and
   f) a second P type lower bulk layer extending from under said second N type buffer layer laterally to a position under said gate at said top surface of said epitaxial layer which is closer to said source than to said drain, said first and second P type bulk layers overlying each other in a region under said gate.

2. The NMOS of claim 1 wherein said gate oxide is of multiple thickness to form a split gate oxide.

3. The NMOS of claim 2 wherein said gate oxide closest to said drain is thicker than said gate oxide closest to said source.

4. The NMOS of claim 1 wherein said source is proximate a first gate sidewall oxides nearest said source and said drain and said drain is proximate a second gate sidewall oxide nearest said drain.

5. The NMOS of claim 1 wherein said source is spaced apart from said gate.

6. The NMOS of claim 5 wherein said first N type upper buffer layer and said first P type lower bulk buffer layer form a resurf region between said gate and said source.

7. The NMOS of claim 5 wherein said drain is spaced apart from said gate.

8. The NMOS of claim 7 wherein said second N type upper buffer layer and said second P type lower bulk buffer layer form a resurf region between said gate and said drain.

9. The NMOS of claim 1 wherein said source is spaced apart from said gate to form a resurf region between said gate and said source which is at least partially under a field oxide.

10. The NMOS of claim 1 wherein said drain is spaced apart from said gate to form a resurf region between said gate and said drain which is at least partially under a field oxide.

11. The NMOS of claim 1 further including:
    a) an N buried layer in said epitaxial layer below said first and second lower bulk buffer layers;
    b) a P⁻ bottom layer is said epitaxial layer above said N buried layer and below said first and second bulk regions;
    c) a N sink ring surrounding said source, said gate, said drain, said first and second upper buffer layers and said first and second lower bulk layers, said N buried layer and said P⁻ bottom layer extending to the inside perimeter of said N sink ring; and
    d) a P⁻ well ring which extends from said top surface of said epitaxial layer to said P⁻ bottom layer; and
    e) wherein said source, said drain, said first and second N type upper buffer layers and said first and second P type lower bulk layers, said N buried layer and said P⁻ bottom layer are between said first and second P⁻ wells.

12. A P channel MOSFET (PMOS) comprising:
    a) a P⁻ epitaxial layer on a substrate;
    b) an N⁻ tub formed in said epitaxial layer;
    b) a source and a drain formed in said epitaxial layer and located on opposite sides of a gate lying on a gate which lies on said epitaxial layer;
    c) a first P type upper buffer layer extending from under said source laterally to a position between a first edge of said gate closest to said source at a top surface of said epitaxial layer and a middle of said gate;
    d) a second P type upper buffer layer extending from under said drain laterally to a position between a second edge of said gate closest to said drain at a top surface of said epitaxial layer and a middle of said gate;
    e) a first N type lower bulk buffer layer extending from under said first N type upper buffer layer laterally to a position under said gate at said top surface of said epitaxial layer which is closer to said drain than to said source; and f) a second N type lower bulk buffer layer extending from under said second N type upper buffer layer laterally to a position under said gate at said top surface of said epitaxial layer which is closer to said source than to said drain, said first and second N type bulk layers overlying each other in a region under said gate.

13. The PMOS of claim 12 wherein said gate oxide is of multiple thickness to form a split gate oxide.

14. The PMOS of claim 13 wherein said gate oxide closest to said drain is thicker than said gate oxide closest to said source.

15. The PMOS of claim 12 wherein said source is proximate a first gate sidewall oxides nearest said source and said drain and said drain is proximate a second gate sidewall oxide nearest said drain.

16. The PMOS of claim 12 wherein said source is spaced apart from said gate.

17. The PMOS of claim 16 wherein said first N type lower bulk buffer layer and said first P type upper buffer layer form a resurf region between said gate and said source.

18. The PMOS of claim 16 wherein said drain is spaced apart from said gate.

19. The PMOS of claim 18 wherein said second N type lower bulk buffer layer and said second P type upper buffer layer form a resurf region between said gate and said drain.

20. The PMOS of claim 12 wherein said source is spaced apart from said gate to form a resurf region between said gate and said source which is at least partially under a field oxide.

21. The PMOS of claim 12 wherein said drain is spaced apart from said gate to form a resurf region between said gate and said drain which is at least partially under a field oxide.

* * * * *